(12) United States Patent
Chung et al.

(10) Patent No.: US 12,324,289 B2
(45) Date of Patent: Jun. 3, 2025

(54) DISPLAY DEVICE

(71) Applicant: LG ELECTRONICS INC., Seoul (KR)

(72) Inventors: Indo Chung, Seoul (KR); Yongdae Kim, Seoul (KR); Youngdo Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 18/681,712

(22) PCT Filed: Aug. 27, 2021

(86) PCT No.: PCT/KR2021/011540
§ 371 (c)(1),
(2) Date: Feb. 6, 2024

(87) PCT Pub. No.: WO2023/027217
PCT Pub. Date: Mar. 2, 2023

(65) Prior Publication Data
US 2024/0266491 A1 Aug. 8, 2024

(51) Int. Cl.
*H10H 20/857* (2025.01)
*G06F 1/16* (2006.01)
*H01L 25/075* (2006.01)

(52) U.S. Cl.
CPC ......... *H10H 20/857* (2025.01); *G06F 1/1652* (2013.01); *H01L 25/0753* (2013.01)

(58) Field of Classification Search
CPC . H01L 33/62; H01L 25/0753; H01L 33/0066; H01L 33/20; H01L 33/44; H01L 27/156; H01L 27/124; H01L 33/36; G06F 1/1652
See application file for complete search history.

(56) References Cited

U.S. PATENT DOCUMENTS

| 10,243,011 | B2* | 3/2019 | Park ................... H01L 27/1248 |
| 2020/0168662 | A1 | 5/2020 | Kim et al. |
| 2020/0168777 | A1* | 5/2020 | Kang ..................... H01L 33/36 |
| 2021/0248977 | A1 | 8/2021 | Zhang et al. |
| 2021/0273131 | A1 | 9/2021 | Kang et al. |
| 2022/0029058 | A1 | 1/2022 | Kim et al. |

(Continued)

FOREIGN PATENT DOCUMENTS

| CN | 112750854 A | 5/2021 |
| EP | 3 855 418 A1 | 7/2021 |

(Continued)

OTHER PUBLICATIONS

International Search Report (PCT/ISA/210) issued in PCT/KR2021/011540, dated May 26, 2022.

*Primary Examiner* — Ratisha Mehta
(74) *Attorney, Agent, or Firm* — Birch, Stewart, Kolasch & Birch, LLP

(57) ABSTRACT

The display device can include a substrate, a first insulating layer on the substrate, first and second assembling wirings on the substrate, a second insulating layer disposed on the first and second assembling wirings and having a first hole and at least one or more second hole extending in a lateral direction of the first hole, a semiconductor light emitting device in the first hole, and a connection electrode in the second hole.

15 Claims, 17 Drawing Sheets

(56) References Cited

U.S. PATENT DOCUMENTS

| | | |
|---|---|---|
| 2022/0052034 A1 | 2/2022 | Chi et al. |
| 2022/0254961 A1 | 8/2022 | Chang et al. |
| 2022/0352446 A1 | 11/2022 | Chung et al. |
| 2022/0367774 A1 | 11/2022 | Kim et al. |
| 2023/0005887 A1 | 1/2023 | Kwon et al. |
| 2023/0049446 A1 | 2/2023 | Kim et al. |
| 2023/0110862 A1 | 4/2023 | Kim et al. |

FOREIGN PATENT DOCUMENTS

| | | |
|---|---|---|
| KR | 10-2019-0106885 A | 9/2019 |
| KR | 10-2030323 B1 | 10/2019 |
| KR | 10-2020-0014868 A | 2/2020 |
| KR | 10-2020-0026775 A | 3/2020 |
| KR | 10-2020-0026845 A | 3/2020 |
| KR | 10-2020-0066438 A | 6/2020 |
| KR | 10-2168570 B1 | 10/2020 |
| WO | WO 2021/033802 A1 | 2/2021 |
| WO | WO 2021/054491 A1 | 3/2021 |
| WO | 2021/149861 A1 | 7/2021 |

\* cited by examiner

FIG. 1 (CONVENTIONAL)
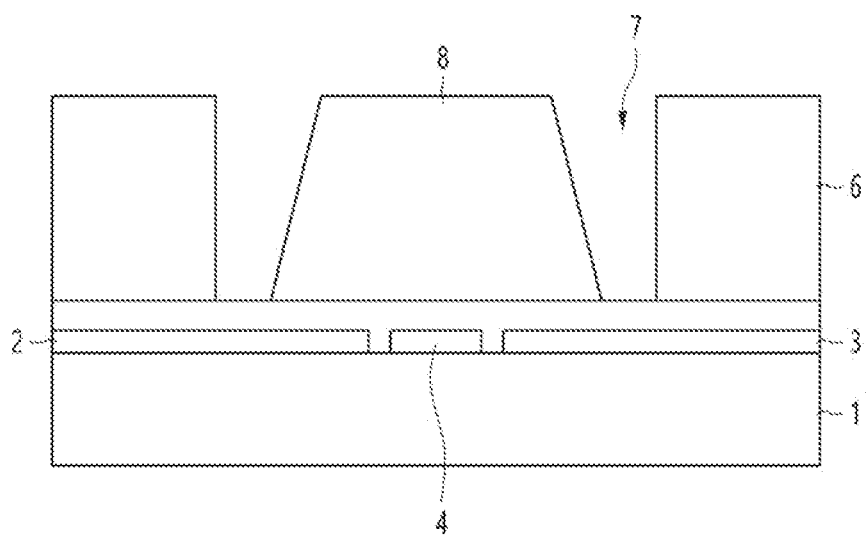
FIG. 2 (CONVENTIONAL)
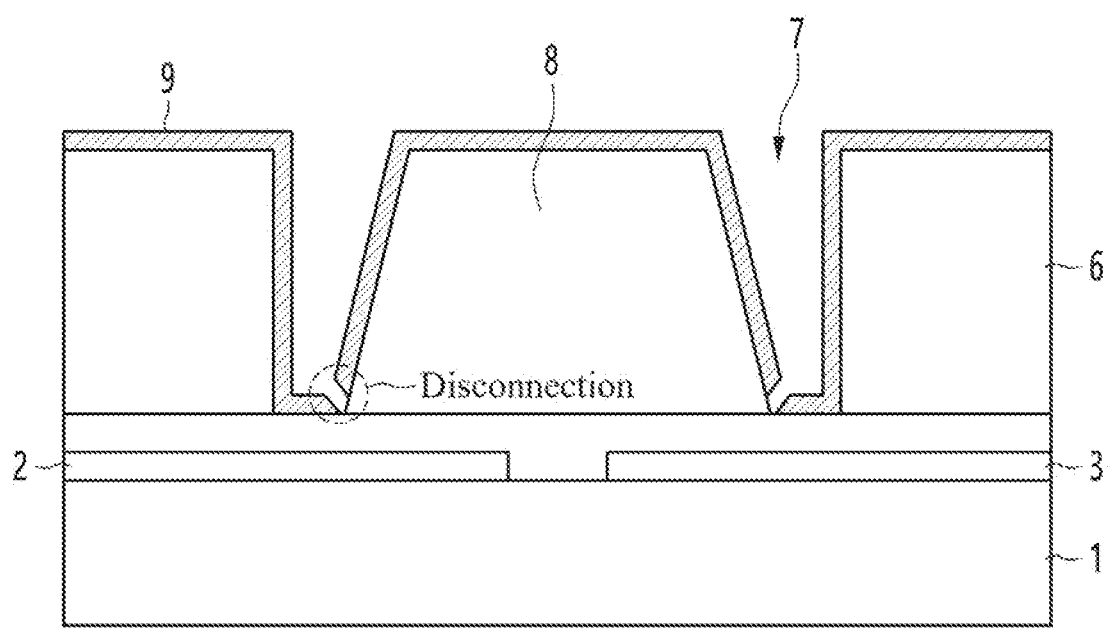

DISPLAY DEVICE

CROSS REFERENCE TO RELATED APPLICATIONS

This application is the National Phase of PCT International Application No. PCT/KR2021/011540, filed on Aug. 27, 2021, all of which is hereby expressly incorporated by reference into the present application.

BACKGROUND OF THE DISCLOSURE

Field

The embodiment relates to a display device.

Discussion of the Related Art

A display device displays high-definition image using self-emissive device such as a light emitting diode as a light source for a pixel. The light emitting diode exhibits excellent durability even under harsh environmental conditions and is capable of long lifespan and high luminance, so that that that it is attracting attention as a light source for next-generation display devices.

Recently, research is in progress to manufacture ultra-small light emitting diodes using highly a material having reliable inorganic crystal structure and dispose them on the panel of a display device (hereinafter referred to as "display panel") to use them as a light source for a next-generation pixel.

This display device is expanding beyond a flat display into various forms such as a flexible display, a foldable display, a stretchable display, and a rollable display.

In order to realize high resolution, the size of the pixel is gradually becoming smaller, and numerous light emitting devices must be aligned in the smaller pixel, so that that research on the manufacture of ultra-small light emitting diodes as small as micro- or nano-scale is actively taking place.

Typically, a display panel contains millions to tens of millions of pixels. Accordingly, because it is very difficult to align at least one or more light emitting device in each of tens of millions of small pixels, various studies on ways to align light emitting devices in the display panel are being actively conducted recently.

As the size of light emitting devices becomes smaller, transferring these light emitting devices onto a substrate is becoming a very important problem to solve. Transfer technologies that have been recently developed include a pick and place process, a laser lift-off method, a self-assembly method, etc. In particular, the self-assembly method that transfers light emitting devices onto a substrate using a magnetic body (or magnet) has recently been in the spotlight.

In the self-assembly method, numerous light emitting devices are dropped into a bath containing a fluid, and as the magnetic body moves, the light emitting devices dropped into the fluid are moved to each pixel on the substrate, and the light emitting devices are aligned at each pixel. Therefore, the self-assembly method is attracting attention as a next-generation transfer method because it can quickly and accurately transfer numerous light emitting devices onto a substrate.

FIG. 1 is an exemplary diagram showing a conventional display device.

As shown in FIG. 1, first and second assembling wirings 2 and 3 and an electrode wiring 4 are disposed on a substrate 1. In this instance, after the light emitting device 8 is assembled in the assembly hole 7 of the barrier rib 6 using the first and second assembling wirings 2 and 3, the electrode wiring 4 is electrically connected to the lower side of the light emitting device 8.

Recently, the gap between the first assembling wiring 2 and the second assembling wiring 3 is decreasing for increasingly high-resolution displays. Accordingly, there is no space margin for disposing the electrode wiring 4 between the first assembling wiring 2 and the second assembling wiring 3, so that the electrode wiring 4 cannot be disposed any more.

To solve this problem, research is being attempted to electrically connect the side portion of the light emitting device 8.

FIG. 2 is another example diagram showing a conventional display device.

As shown in FIG. 2, first and second assembling wirings 2 and 3 are disposed on the substrate 1, and a light emitting device 8 is assembled into the assembly hole 7 of the barrier rib 6 using the first and second assembling wirings 2 and 3.

Afterwards, a metal film 9 is deposited on the barrier rib 6, and the metal film 9 is etched to be electrically connected to a side portion of the light emitting device 8.

However, as shown in FIG. 2, since the gap between the outer side surface of the light emitting device 8 and the inner side surface of the assembly hole 7 is too narrow, the outer side surface of the light emitting device 8 and the inner side surface of the assembly hole 7 is difficult to deposit stably, resulting in electrical disconnection. Such electrical disconnection has the problem of causing lighting defects.

To solve this problem, in order to widen the gap between the outer side surface of the light emitting device 8 and the inner side surface of the assembly hole 7, the assembly hole 7 must be enlarged, which has the problem of running counter to high resolution.

SUMMARY OF THE DISCLOSURE

An object of the embodiment is to solve the foregoing and other problems.

Another object of the embodiment is to provide a display device capable of preventing lighting defects.

Another object of the embodiment is to provide a display device capable of improving reliability by strengthening adhesion.

Another object of the embodiment is to provide a display device capable of increasing the assembly rate.

The technical problems of the embodiments are not limited to those described in this item and include those that can be understood through the description of the invention.

According to one aspect of the embodiment to achieve the above or other objects, a display device, comprising: a substrate; a first insulating layer on the substrate; first and second assembling wirings on the substrate; a second insulating layer disposed on the first and second assembling wirings and having a first hole and at least one or more second hole extending in a lateral direction of the first hole; a semiconductor light emitting device in the first hole; and a connection electrode in the second hole.

The second hole can comprise a second-first hole on the first assembling wiring, and a second-second hole on the second assembling wiring.

The connection electrode can comprise a first connection electrode disposed in the second-first hole, and a second connection electrode disposed in the second-second hole.

The connection electrode can comprise a third connection electrode disposed along a perimeter of the semiconductor light emitting device within the first hole.

Each of the first and second connection electrodes can comprise a first connection region in contact with a side portion of the semiconductor light emitting device, a second connection region extending from the first connection region and contacting an upper surface of one of the first and second assembling wirings, and a third connection region extending from the second connection region and contacting an inner side surface of the second hole.

The second hole can comprise two or more second-first holes on the first assembling wiring, and two or more second-second holes on the second assembling wiring.

In the embodiment, as shown in FIGS. 9 to 11, at least one or more second hole 362 or 363 can be formed extending laterally from the first hole 361 in which the semiconductor light emitting device 150 is formed and the connection electrodes 371 and 372 can be disposed in the hole, so that electrical disconnection does not occur in the connection electrodes 371 and 372 and then lighting defects can be prevented.

In the embodiment, as shown in FIGS. 9 to 11, connection electrodes 371, 372, and 373 can be disposed not only in the first hole 361 but also in the second holes 362 and 363, and can be attached to the side surface of the semiconductor light emitting device 150, the upper surface of the first and/or second assembling wiring 321, 322 through the first insulating layer 330, and the inner side surface of the first hole 361 and the second holes 362 and 363, so that the bonding force of the semiconductor light emitting device 150 can be strengthened and reliability can be improved.

In the embodiment, as shown in FIGS. 9 to 11, since the thick second insulating layer 340 is removed by forming the second holes 362 and 363, when there are no second holes 362 and 363, the strength of the electric field in the second holes 362 and 363 can increase and the dielectrophoretic force can increase, so that the semiconductor light emitting device 150 can be pulled by a stronger dielectrophoretic force, thereby improving the assembly rate.

In the embodiment, as shown in FIGS. 9 to 11, since the connection electrodes 371, 372, and 373 can be electrically connected along the perimeter of the semiconductor light emitting device 150, even if the semiconductor light emitting device 150 is biased to one side in the first hole 361, a uniform voltage can be supplied, so that image quality can be improved by ensuring uniform luminance between each sub-pixel.

In the embodiment, as shown in FIG. 21, more connection electrodes can be electrically connected to the semiconductor light emitting device 150, thereby enabling smoother voltage supply and improving luminance.

In the embodiment, as shown in FIG. 21, the semiconductor light emitting device 150 can be more tightly coupled to the substrate 310 by using more connection electrodes, so that the bonding force can be further improved.

In the embodiment, as shown in FIG. 21, the second holes 362 to 365 can be formed at equal intervals from each other, so that during self-assembly, the semiconductor light emitting device 150 assembled in the first hole 361 can be aligned in the normal position without being biased to one side.

In the embodiment, as shown in FIGS. 22 and 23, when the first and second assembling wirings 321 and 322 are disposed in different layers, the lower side of the semiconductor light emitting device 150 can be directly connected to the second assembling wiring 322, and the side portion of the semiconductor light emitting device 150 can be connected to the first assembling wiring 321 and/or the second assembling wiring 322 using connection electrodes 371, 372, and 373, so that voltage can be supplied through more diverse paths, improving luminance and preventing lighting defects.

Additional scope of applicability of the embodiments will become apparent from the detailed description that follows. However, since various changes and modifications within the spirit and scope of the embodiments can be clearly understood by those skilled in the art, the detailed description and specific embodiments, such as preferred embodiments, should be understood as being given by way of example only.

BRIEF DESCRIPTION OF THE DRAWINGS

FIG. 1 is an exemplary diagram showing a conventional display device.

FIG. 2 is another example diagram showing a conventional display device.

Figure 3:
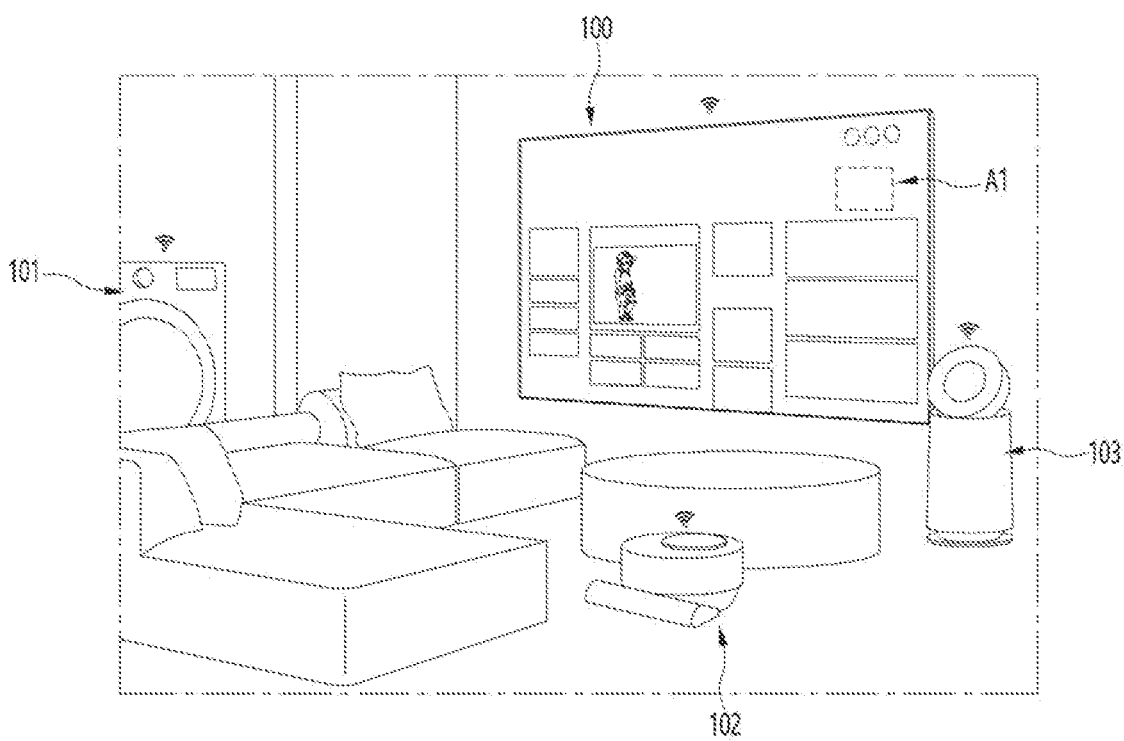
FIG. 3 shows a living room of a house where a display device according to an embodiment is disposed.

The sizes, shapes, dimensions, etc. of elements shown in the drawings can differ from actual ones. In addition, even if the same elements are shown in different sizes, shapes, dimensions, etc. between the drawings, this is only an example on the drawing, and the same elements have the same sizes, shapes, dimensions, etc. between the drawings.

DETAILED DESCRIPTION OF EMBODIMENTS

Hereinafter, the embodiment disclosed in this specification will be described in detail with reference to the accompanying drawings, but the same or similar elements are given the same reference numerals regardless of reference numerals, and redundant descriptions thereof will be omitted. The suffixes 'module' and 'unit' for the elements used in the following descriptions are given or used interchangeably in consideration of ease of writing the specification, and do not themselves have a meaning or role that is distinct from each other. In addition, the accompanying drawings are for easy understanding of the embodiment disclosed in this specification, and the technical idea disclosed in this specification is not limited by the accompanying drawings. Also, when an element such as a layer, region or substrate is referred to as being 'on' another element, this means that there can be directly on the other element or be other intermediate elements therebetween.

A display device described in this specification can comprise a TV, a signage, a mobile phone, a smart phone, a head-up display (HUDs) for automobiles, a backlight unit for a laptop computer, and a display for VR or AR. etc. However, the configuration according to the embodiment described in this specification can be applied to a device capable of displaying even if it is a new product type that is developed in the future.

Hereinafter, a light emitting device according to an embodiment and a display device including the same will be described.

FIG. 3 illustrates a living room of a house, in which a display device is disposed, according to the embodiment.

Referring to FIG. 3, according to the embodiment, a display device 100 can display the status of various electronic devices, such as a washing machine 101, a robot cleaner 102, or an air purifier 103, can make communication with various electronic products based on Internet of Things (IoT), and can control various electronic products based on the setting data of a user.

According to the embodiment, the display device 100 can comprise a flexible display manufactured on a thin and flexible substrate. The flexible display can maintain the characteristic of an existing flat panel display, and can be bendable and rollable, like paper.

Visible information in the flexible display device can be realized by independently controlling the emitting of light from unit pixels arranged in the form of a matrix. The unit pixel is the minimum pixel to realize one color. The unit pixel of the flexible display device can be realized with a light emitting device. According to an embodiment, the light emitting device can comprise, but is not limited to, a micro-LED or a nano-LED.

Figure 4:
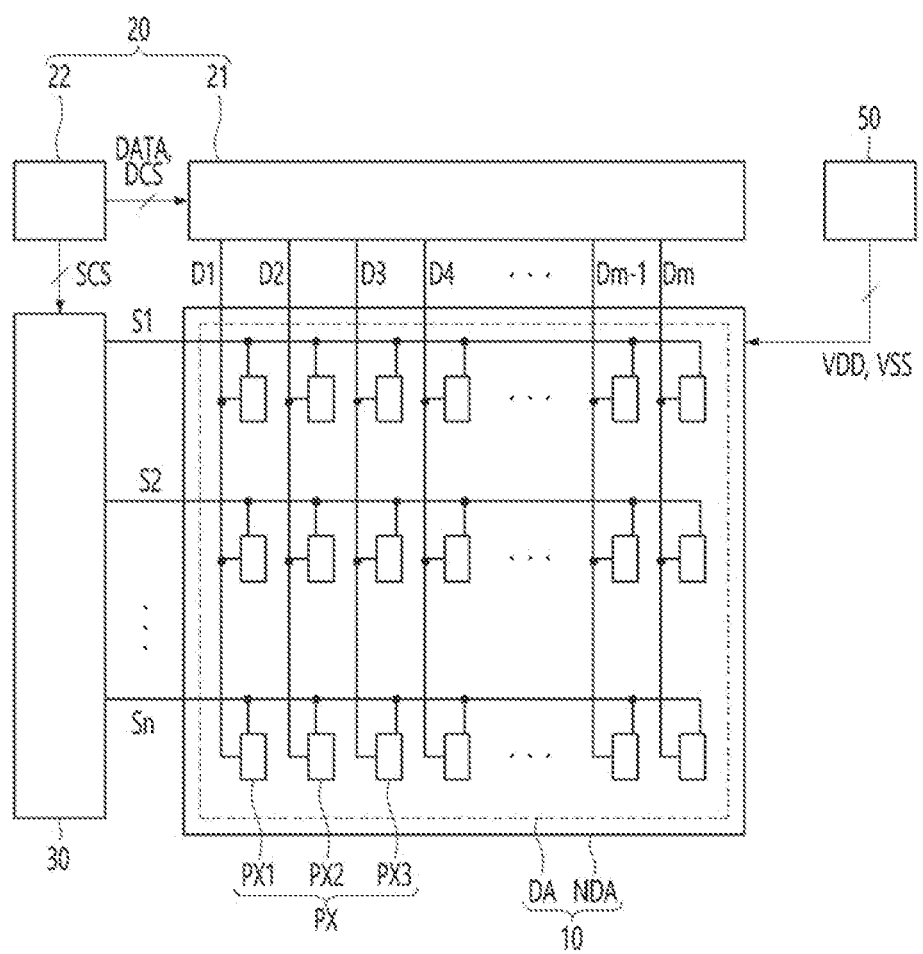
FIG. 4 is a block diagram schematically showing a display device according to an embodiment.
Figure 5:
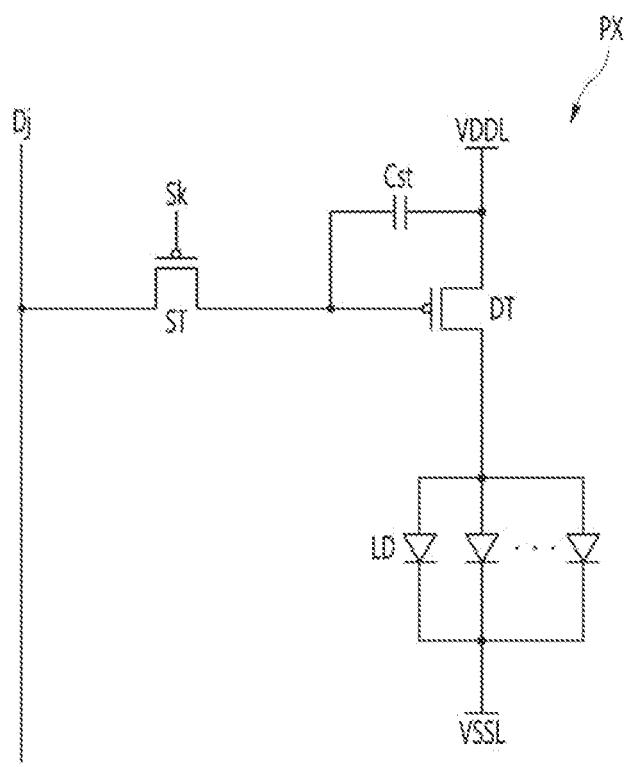
FIG. 5 is a circuit diagram showing an example of the pixel of FIG. 4.

FIG. 4 is a block diagram schematically illustrating a display device according to the embodiment, and FIG. 5 is a circuit diagram illustrating a pixel of FIG. 5.

Referring to FIGS. 4 and 5, according to the embodiment, the display device 100 can comprise a display panel 10, a driving circuit 20, a scan driver 30, and a power supply circuit 50.

According to an embodiment, the display device 100 can drive the light emitting device in an active matrix (AM) manner or a passive matrix (PM) manner.

The driving circuit 20 can comprise a data driver 21 and a timing controller 22.

The display panel 10 can have, but is not limited to, the shape of a rectangle. In other words, the display panel 10 can be formed in a circular shape or an oval shape. At least one side of the display panel 10 can be formed to be bent with a specific curvature.

The display panel 10 can be divided into a display region DA and a non-display region NDA disposed at a peripheral portion of the display region DA. The display region DA has pixels PX formed therein to display an image. The display panel 10 can comprise data lines D1-Dm (m is an integer value equal to or greater than 2), scan lines S1-Sn (n is an integer value equal to or greater than 2) crossing the data lines D1-Dm, a high-potential voltage line to supply a high-potential voltage, a low-potential voltage line to supply a low-potential voltage, and pixels PX connected with the data lines D1-Dm and the scan lines S1-Sn.

Each pixel PX can comprise a first sub-pixel PX1, a second sub-pixel PX2, and a third sub-pixel PX3. The first sub-pixel PX1 can emit first color light having a first main wavelength, the second sub-pixel PX2 can emit second color light having a second main wavelength, and the third sub-pixel PX3 can emit third color light having a third main wavelength. The first color light can be red light, the second color light can be green light, and the third color light can be blue light, but the embodiment is not limited thereto. In addition, although FIG. 4 illustrates that each pixel PX includes three sub-pixels, the embodiment is not limited thereto. In other words, each pixel PX can comprise at least four sub-pixels.

Figure 6:
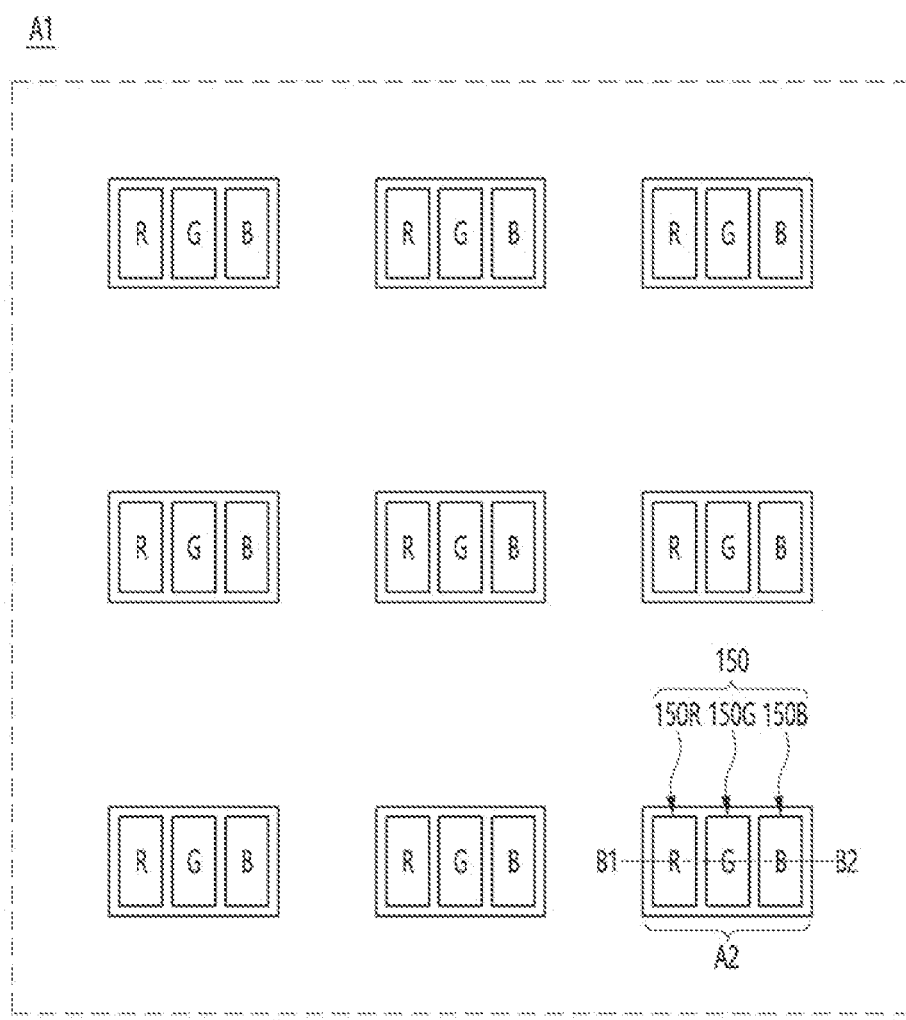
FIG. 6 is an enlarged view of the first panel area in the display device of FIG. 3.

Each of the first sub-pixel PX1, the second sub-pixel PX2, and the third sub-pixel PX3 can be connected with at least one of the data lines D1-Dm, at least one of the scan lines S1-Sn, and the high-potential voltage line, respectively. The first sub-pixel PX1 can comprise light emitting devices LD, a plurality of transistors to supply currents to the light emitting devices LD, and at least one capacitor Cst, as illustrated in FIG. 6.

Although not illustrated in the drawings, each of the first sub-pixel PX1, the second sub-pixel PX2, and the third sub-pixel PX3 can comprise only one light emitting device LD and at least one capacitor Cst.

Each of light emitting devices LD can be a semiconductor light emitting diode including a first electrode, a plurality of conductivity type semiconductor layers, and a second electrode. In this instance, the first electrode can be an anode electrode, and the second electrode can be a cathode electrode, but the embodiment is not limited thereto.

The light emitting device can be one of a lateral-type light emitting device, a flipchip-type light emitting device, and a vertical-type light emitting device.

A plurality of transistors can comprise a driving transistor DT to supply a current to the light emitting devices LD and a scan transistor ST to supply a data voltage to a gate electrode of the driving transistor DT, as illustrated in FIG. 5. The driving transistor DT can comprise a gate electrode connected with a source electrode of the scan transistor ST, a source electrode connected with a high-potential voltage line to which a high-potential voltage is applied, and a drain electrode connected with first electrodes of the light emitting devices LD. The scan transistor ST can comprise a gate electrode connected with a scan line Sk (k is an integer value satisfying 1≤k≤n), the source electrode connected with the gate electrode of the driving transistor DT, and a drain electrode connected with a data line Dj (j is an integer value satisfying 1≤j≤m).

The storage capacitor Cst is formed between the gate electrode and the source electrode of the driving transistor DT. The storage capacitor Cst is charged with the difference between a gate voltage and a source voltage of the driving transistor DT.

The driving transistor DT and the scan transistor ST can be formed with thin film transistors. In addition, the above description has been made with reference to FIG. 5 while focusing on that the driving transistor DT and the scan transistor ST are realized with p-type metal oxide semiconductor field effect transistors (MOSFET), but the embodiment is not limited thereto. The driving transistor DT and the scan transistor ST can be realized with an N-type MOSFET. In this instance, the positions of a source electrode and a drain electrode can be changed in each of the driving transistor DT and the scan transistor ST.

In addition, in FIG. 5, each of the first sub-pixel PX1, the second sub-pixel PX2, the third sub-pixel PX3 has a 2 transistor 1 capacitor (2T1C) structure having one driving transistor DT, one scan transistor ST, and one capacitor Cst, but the embodiment is not limited thereto. Each of the first sub-pixel PX1, the second sub-pixel PX2, the third sub-pixel PX3 can comprise a plurality of scan transistors ST and a plurality of storage capacitors Cst.

Since the second sub-pixel PX2 and the third sub-pixel PX3 are expressed in the substantially same circuit diagram as that of the first sub-pixel PX1, the details thereof will be omitted below.

The driving circuit 20 outputs signals and voltages for driving the display panel 10. The driving circuit 20 can comprise the data driver 21 and the timing controller 22.

The data driver 21 receives digital video data DATA and a source control signal DCS from the timing controller 22. The data driver 21 converts the digital video data DATA into analog data voltages in response to the source control signal DCS and supplies the analog data voltages to the data lines D1-Dm of the display panel 10.

The timing controller 21 receives the digital video data DATA and timing signals from a host system. The timing signals can comprise a vertical sync signal, a horizontal sync signal, a data enable signal, and a dot clock. The host system can be an application processor of a smartphone or a tablet PC, a monitor, or a system on chip of a television (TV).

The timing controller 22 generates control signals for controlling the operating timing of the data driver 21 and the scan driver 30. The control signals can comprise a source control signal DCS for controlling the operating timing of the data driver 21 and a scan control signal SCS for controlling the operating timing of the scan driver 30.

The driving circuit 20 can be disposed in the non-display region NDA provided at one side of the display panel 10. The driving circuit 20 can be provided in the form of an integrated circuit (IC), and can be mounted in a chip on glass (COG) manner, a chip on plastic (COP) manner, or an ultrasonic wave bonding manner on the display panel 10, but the embodiment is not limited thereto. For example, the driving circuit 20 can be mounted on a circuit board (not illustrated) instead of the display panel 10.

The data driver 21 can be mounted on in a chip on glass (COG) manner, a chip on plastic (COP) manner, or an ultrasonic wave bonding manner on the display panel 10, and the timing controller 21 can be mounted on the circuit board.

The scan driver 30 receives a scan control signal SCS from the timing controller 22. The scan driver 30 generate scan signals in response to the scan control signal SCS and supplies the scan signals to the scan lines S1-Sn of the display panel 10. The scan driver 30, which includes a plurality of transistors, can be formed in the non-display region NDA of the display panel 10. Alternatively, the scan driver 30 can be provided in the form of the IC. In this instance, the scan driver 30 can be mounted on a flexible gate film attached to another side of the display panel 10.

The circuit board can be attached onto pads provided at one edge of the display panel 10 using an anisotropic conductive film. Due to this, lead lines of the circuit board can be electrically connected with pads. The circuit board can be a flexible film such as a flexible printed circuit board, a printed circuit board, or a chip on film. The circuit board can be bent under the display panel 10. Due to this, one side of the circuit board can be attached to one edge of the display panel 10, and an opposite side of the circuit board can be disposed under the display panel 10 and connected with a system board on which the host system is mounted.

A power supply circuit 50 can generate voltages necessary for driving the display panel 10, based on main power applied from the system board and can apply the voltages to the display panel 10. For example, the power supply circuit 50 can generate a high-potential voltage VDD and a low-potential voltage VSS for driving the light emitting devices LD of the display panel 10, based on the main power, and can supply the high-potential voltage VDD and the low-potential voltage VSS to the high-potential voltage line and the low-potential voltage line of the display panel 10. In addition, the power supply circuit 50 can generate driving voltages for driving the driving circuit 20 and the scan driver 30, based on the main power, and can supply the driving voltages to the driving circuit 20 and the scan driver 30.

FIG. 6 is an expanded view of a first panel region in the display device of FIG. 3.

Referring to FIG. 6, according to the embodiment, the display device 100 manufactured, as a plurality of panel regions, such as a first panel region A1, are mechanically or electrically connected with each other through tiling.

The first panel region A1 can comprise a plurality of light emitting devices 150 arranged according to unit pixels (reference numeral PX of FIG. 4).

For example, each pixel PX can comprise a first sub-pixel PX1, a second sub-pixel PX2, and a third sub-pixel PX3. For example, a plurality of red light emitting device 150R can be disposed in the first sub-pixel PX1, a plurality of green light emitting devices 150G can be disposed in the second sub-pixel PX2, and a plurality of blue light emitting devices 150B can be disposed in the third sub-pixel PX3. The unit pixel PX can further include a fourth sub-pixel having no the light emitting device, but the embodiment is not limited thereto.

Figure 7:
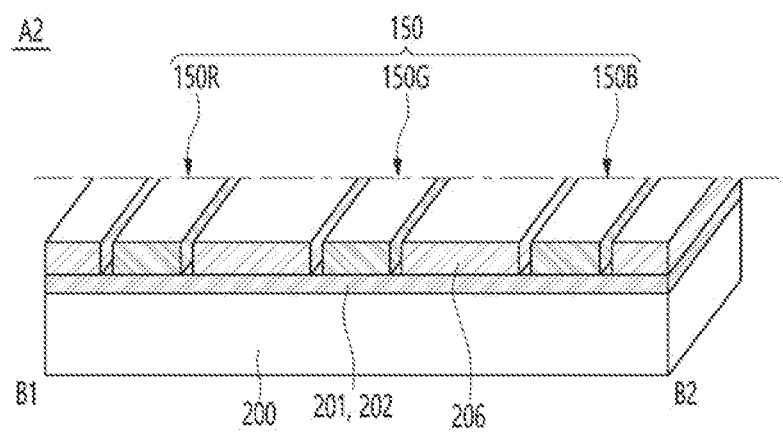
FIG. 7 is an enlarged view of area A2 in FIG. 6.

FIG. 7 is an enlarged view of region A2 of FIG. 6.

Referring to FIG. 7, according to the embodiment, the display device 100 can comprise a substrate 200, assembling wirings 201 and 202, an insulating layer 206, and a plurality of light emitting devices 150. The display device 100 can further include a larger number of components.

The assembling wirings can comprise a first assembling wiring 201 and a second assembling wiring 202 spaced apart from each other. The first assembling wiring 201 and the second assembling wiring 202 can be provided to generate the dielectrophoretic force for assembling the light emitting device 150. The light emitting device 150 can be one of a lateral-type light emitting device, a flipchip-type light emitting device, and a vertical-type light emitting device.

The light emitting device 150 includes a red light emitting device 150R, a green light emitting device 150G, and a blue light emitting device 150B, but the embodiment is not limited thereto. For example, the light emitting device 150 can comprise a red phosphor and a green phosphor to realize a red color and a green color, respectively.

The substrate 200 can be a support member that supports components disposed on the substrate 200 or a protection member that protects the components.

The substrate 200 can comprise a rigid substrate or a flexible substrate. The substrate 200 can comprise glass or polyimide. Alternatively, the substrate 200 can comprise a flexible material, such as Polyethylene Naphthalate (PEN), or Polyethylene Terephthalate (PET). Alternatively, the substrate 200 can comprise a transparent material, but the embodiment is not limited thereto.

The insulating layer 206 can comprise a material, such as polyimide, PEN or PET, having an insulating property and a flexible property, and can be integrated with the substrate 200 to form one substrate.

The insulating layer 206 can be a conductive adhesive layer having an adhesive property and a conductive property. The conductive adhesive layer can have a flexible property such that the display device 100 has a flexible function. For example, the insulating layer 206 can be an anisotropy conductive film (ACF) or a conductive adhesive layer including an anisotropy conductive medium or conductive particles. The conductive adhesive layer can be a layer having electrical conductivity in a vertical direction with respect to the thickness thereof, but having an electrically insulating property in a horizontal direction with respect to the thickness thereof.

The insulating layer 206 can comprise an assembling hole 203 to insert the light emitting device 150. Accordingly, the light emitting device 150 can be easily inserted into the assembling hole 203 of the insulating layer 206, in self-assembling. The assembling hole 203 can be named as an insertion hole, a fixing hole, and an alignment hole.

Figure 8:
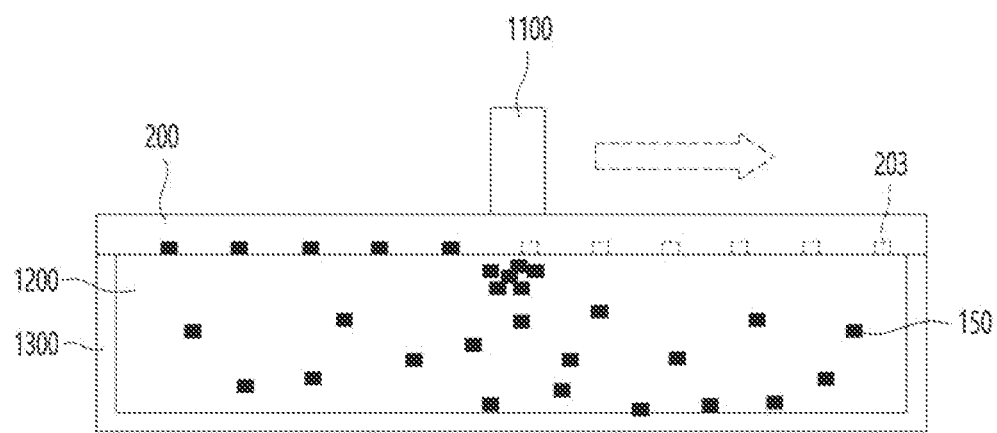
FIG. 8 is a diagram showing an example in which a light emitting device according to an embodiment is assembled on a substrate by a self-assembly method.

FIG. 8 shows that a light emitting device is assembled with a substrate through a self-assembly method according to the embodiment.

The self-assembly method of the light emitting device will be described with reference to FIGS. 7 and 8.

The substrate 200 can be a panel substrate of the display device. Although the following description is described while focusing on the substrate 200 is the panel substrate, the embodiment is not limited thereto.

The substrate 200 can comprise glass or polyimide. In addition, the substrate 200 can comprise a material, such as PEN or PET, having flexibility. Alternatively, the substrate 200 can comprise a transparent material, but the embodiment is not limited thereto.

Referring to FIG. 8, the light emitting device 150 can be introduced into a chamber 1300 filled with a fluid 1200. The fluid 1200 can be de-ionized water, but the embodiment is not limited thereto. The chamber 1300 can be classified into a bath, a container, or a vessel.

Thereafter, the substrate 200 can be disposed on the chamber 1300. According to an embodiment, the substrate 200 can be introduced into the chamber 1300.

As illustrated in FIG. 7, a pair of assembling wirings 201 and 202, which correspond to the light emitting device 150 to be assembled, can be disposed in the substrate 200

The assembling wirings 201 and 202 can comprise a transparent electrode (ITO), or a metal material having excellent conductivity. For example, the assembling wirings 201 and 202 can comprise at least one of titanium (Ti), chromium (Cr), nickel (Ni), aluminum (Al), platinum (Pt), gold (Au), tungsten (W), or molybdenum (Mo), or the alloy thereof.

The assembling wirings 201 and 202 can form an electric field by the voltage supplied from the outside, and the dielectrophoretic force can be formed between the assembling wirings 201 and 202 due to the electric field. The light emitting device 150 can be fixed into the assembling hole 203 on the substrate 200 by the dielectrophoretic force.

The interval between the assembling wirings 201 and 202 is formed to be smaller than the width of the light emitting device 150 and the width of the assembling hole 203, such that the assembling position of the light emitting device 150 using the electric field can be more precisely fixed.

The insulating layer 206 can be formed on the assembling wirings 201 and 202 to protect the assembling wirings 201 and 202 from the fluid 1200, and to prevent a current, which flows through the assembling wirings 201 and 202, from leaking. The insulating layer 206 can be formed in a single layer or a multi-layer including an inorganic insulator, such as silica or alumina, or an organic insulator.

The insulating layer 206 can comprise a material, such as polyimide, PEN or PET, having an insulating property and a flexible property, and can be integrated with the substrate 200 to form one substrate.

The insulating layer 206 can comprise an insulating layer having an adhesive property or a conductive insulating layer having conductivity. The insulating layer 206 can have a flexible property such that the display device 100 has a flexible function.

The insulating layer 206 can have a barrier, and the assembling hole 203 can be formed by the barrier. For example, when the substrate 200 is formed, a part of the insulating layer 206 is removed, such that each light emitting device 150 is assembled with the assembling hole 203 of the insulating layer 206.

The substrate 200 can have assembling holes 203 coupled to light emitting devices 150, and the surface, which has the assembling hole 203, of the substrate 200 can make contact with the fluid 1200. The assembling hole 203 can guide the accurate assembling position of the light emitting device 150.

Meanwhile, the assembling hole 203 can have the shape and the size corresponding to the shape of the light emitting device 150 to be assembled at the corresponding position. Accordingly, another light emitting device or a plurality of light emitting devices can be prevented from being assembled into the assembling hole 203.

Referring back to FIG. 8, after the substrate 200 is disposed, an assembly device 1100 including a magnetic substance can move along the substrate 200. The magnetic substance can comprise a magnet or an electromagnet. The assembly device 1100 can move while making contact with the substrate 200, such that a region influenced by a magnetic field is present in the fluid 1200 as much as possible. According to an embodiment, the assembly device 1100 can comprise a plurality of magnetic substances or can comprise a magnetic substance corresponding to the substrate 200. In this instance, the moving distance of the assembly device 1100 can be limited to be in a specific range.

The light emitting device 150 in the chamber 1300 can move toward the assembly device 1100 due to the magnetic field generated by the assembly device 1100.

The light emitting device 150 can be introduced into the assembling hole 203 to make contact with the substrate 200, while moving toward the assembly device 1100.

In this instance, the electric field applied by the assembling wirings 201 and 202 formed on the substrate 200 can prevent the light emitting device 150, which makes contact with the substrate 200, from being detached from the substrate 200 by the movement of the assembly device 1100.

In other words, the self-assembly method using an electromagnetic field can sharply reduce a time taken when each light emitting device 150 is assembled with the substrate 200. Accordingly, a large-area and high-pixel-density display can be more rapidly and economically realized.

A solder layer (not illustrated) can be additionally formed between the light emitting device 150, which is assembled with the assembling hole 203 in the substrate 200, and the substrate 200, such that the bonding force of the light emitting device 150 can be improved.

Thereafter, an electrode wiring (not illustrated) is connected with the light emitting device 150 to apply power to the light emitting device 150.

Hereinafter, although not illustrated, at least one insulating layer can be formed through the following process. The at least one insulating layer can comprise a transparent resin or a resin including a reflective material or a scattering material.

Meanwhile, in the embodiment, by disposing the connection electrode in at least one or more second hole extending from the first hole in which the semiconductor light emitting device is assembled, electrical disconnection does not occur in the connection electrode, thereby preventing lighting defects.

Various embodiments that can achieve the above technical effects will be described below.

First Embodiment

Figure 9:
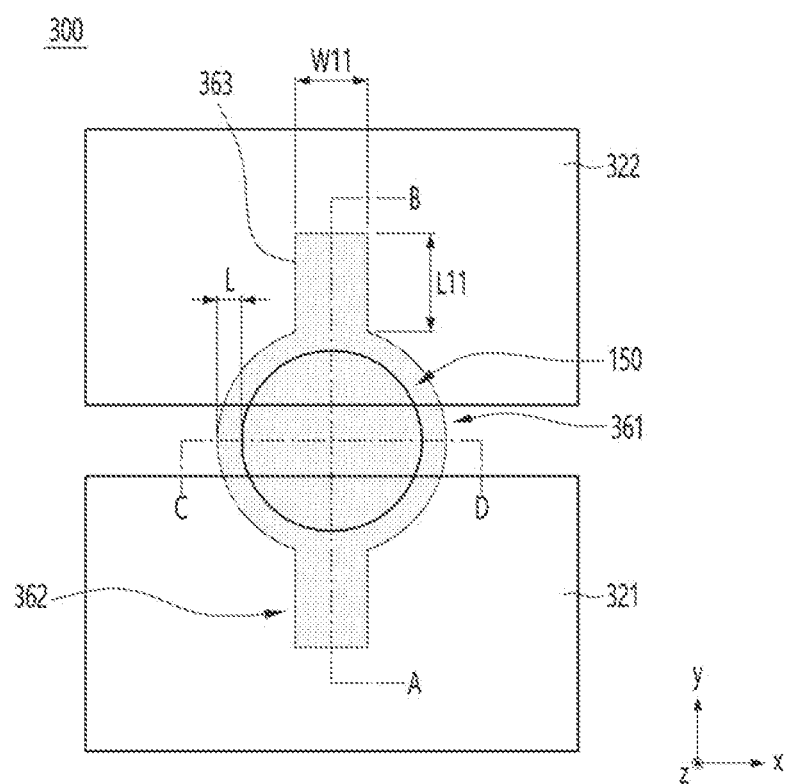
FIG. 9 is a plan view showing a display device according to a first embodiment.
Figure 10:
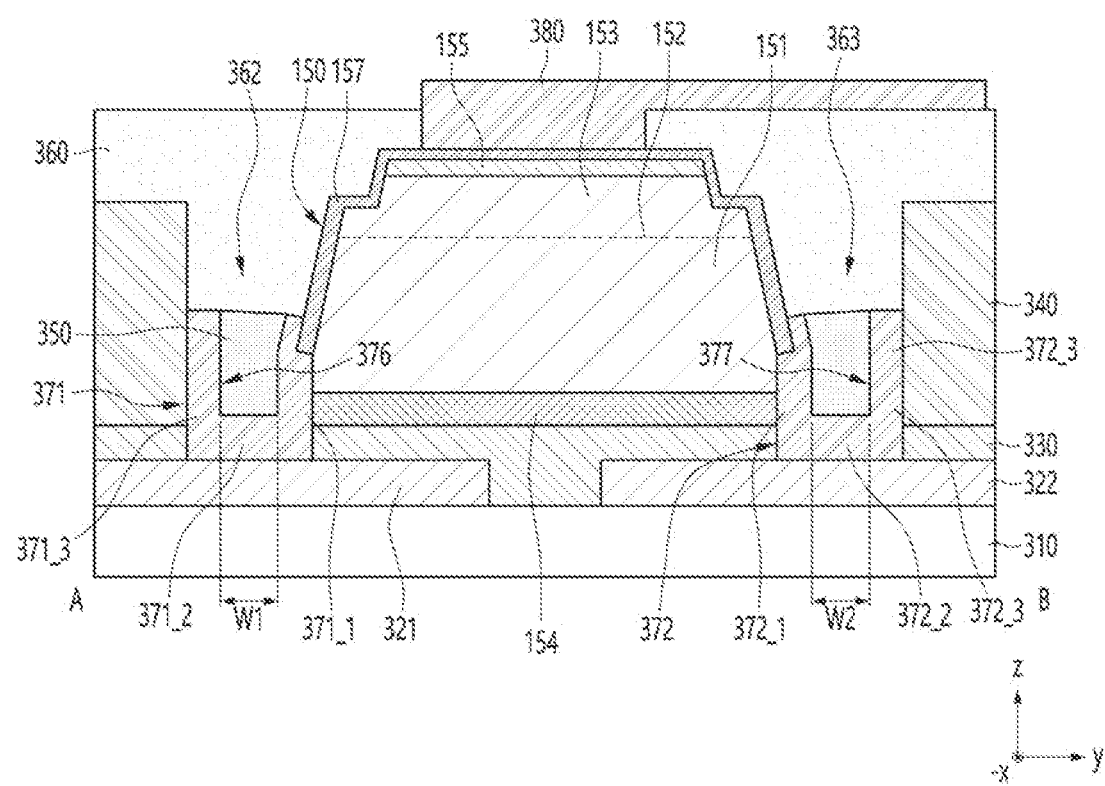
FIG. 10 is a cross-sectional view taken along line A-B of FIG. 9.
Figure 11:
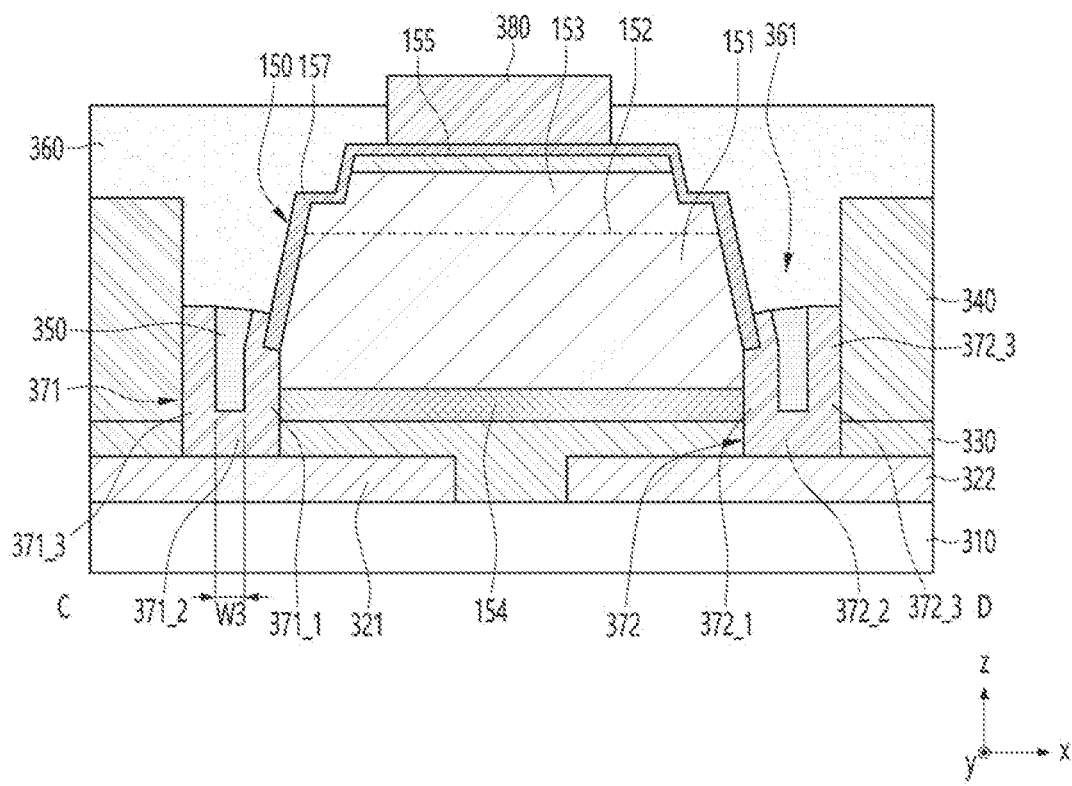
FIG. 11 is a cross-sectional view taken along line C-D in FIG. 9.

FIG. 9 is a plan view showing a display device according to a first embodiment. FIG. 10 is a cross-sectional view taken along line A-B of FIG. 9. FIG. 11 is a cross-sectional view taken along line C-D of FIG. 9.

Referring to FIGS. 9 to 11, the display device 300 according to the first embodiment can comprise a substrate 310, a first insulating layer 330, first and second assembling wirings 321 and 322, a second insulating layer 340, a semiconductor light emitting device 150, and connection electrodes 371, 372, and 373.

The substrate 310 can be a support member that supports components disposed on the substrate 310 or a protection member that protects the components.

The first and second assembling wirings 321 and 322 can be disposed on the substrate 310. For example, the first and second assembling wirings 321 and 322 can be disposed on the same layer. For example, it can be in contact with the first and second assembling wirings 321 and 322 and the upper surface of the substrate 310, but is not limited thereto. For example, the first and second assembling wirings 321 and 322 can be disposed on the same layer. For example, the first and second assembling wirings 321 and 322 can be disposed parallel to each other. The first and second assembling wirings 321 and 322 can serve to assemble the semiconductor light emitting device 150 into the first hole 361 in a self-assembly method. That is, during self-assembly, an electric field can be generated between the first assembling wiring 321 and the second assembling wiring 322 by a voltage supplied to the first and second assembling wirings 321 and 322, and the moving semiconductor light emitting device 150 can be assembled in the first hole 361 by the assembly device (1100 in FIG. 10) using the dielectrophoretic force formed by the electric field.

The first insulating layer 330 can be disposed on the substrate 310. For example, the first insulating layer 330 can be made of an inorganic material or an organic material. For example, the first insulating layer 330 can be made of a material having a dielectric constant related to the dielectrophoretic force.

The second insulating layer 340 can be disposed on the first and second assembling wirings 321 and 322. The second insulating layer 340 can have a first hole 361 for assembling the semiconductor light emitting device 150. For example, the second insulating layer 340 can be exposed within the first hole 361. For example, the lower surface of the first hole 361 can be the upper surface of the second insulating layer 340.

The thickness of the second insulating layer 340 can be determined by considering the thickness of the semiconductor light emitting device 150. For example, the thickness of the second insulating layer 340 can be smaller than the thickness of the semiconductor light emitting device 150. Accordingly, the upper side of the semiconductor light emitting device 150 can be positioned higher than the upper surface of the second insulating layer 340. That is, the upper side of the semiconductor light emitting device 150 can protrude upward from the upper surface of the second insulating layer 340.

Considering the tolerance margin for forming the first hole 361 and the margin for easily assembling the semiconductor light emitting device 150 in the first hole 361, etc., the size of the first hole 361 can be determined. For example, the size of the first hole 361 can be greater than the size of the semiconductor light emitting device 150. For example, when the semiconductor light emitting device 150 is assembled in the center of the first hole 361, the distance between the outer side surface of the semiconductor light emitting device 150 and the inner side surface of the first hole 361 can be 2 μm or less, but is not limited thereto.

For example, the first hole 361 can have a shape corresponding to the shape of the semiconductor light emitting device 150. For example, when the semiconductor light emitting device 150 have a circular shape, the first hole 361 can also have a circular shape. For example, when the semiconductor light emitting device 150 have a rectangular shape, the first hole 361 can also have a rectangular shape.

The second insulating layer 340 can have at least one or more second hole 362 or 363 extending in a lateral direction of the first hole 361.

For example, the second hole can comprise a second-first hole 362 formed on the first assembling wiring 321 and a second-second hole 363 formed on the second assembling wiring 322. For example, the second-first hole 362 and the second-second hole 363 can be disposed along the Y direction. For example, the second-first hole 362 can be formed by extending from the first hole 361 along the −Y direction, and the second-second hole 363 can be formed by extending along the +Y direction from the first hole 361.

Meanwhile, the second holes 362 and 363 can have sufficient space so that metal films for forming the connection electrodes 371, 372, and 373 can be continuously deposited without interruption. For example, the second holes 362 and 363 can have the same width W11 and the same length L11, but is not limited thereto. For example, the width W11 can be 2 μm to 4 μm. For example, the length L11 can be 2 μm to 4 μm. When the width W11 or the length L11 is less than 2 μm, the space of the second holes 362 and 363 can be narrow, so that breaks can occur in the metal film. If the width W11 or the length L11 exceeds 4 μm, as the space becomes larger and another semiconductor light emitting device is attached to the second holes 362 and 363 during self-assembly, manufacturing costs can increase due to assembly defects and waste of the semiconductor light emitting devices.

For example, the width W11 or the length L11 of the second holes 362 and 363 can be smaller than the gap between the first assembling wiring 321 and the second assembling wiring 322. For example, the width W11 or the length L11 of the second holes 362 and 363 can be less than ½ of the diameter of the semiconductor light emitting device 150. When the width W11 or the length L11 of the second holes 362 and 363 exceeds ½ of the diameter of the semiconductor light emitting device 150, the space of the second holes 362 and 363 can be large and another semiconductor light emitting device can be attached to the second holes 362 and 363, so that manufacturing costs can increase due to assembly defects and waste of the semiconductor light emitting devices.

For example, the width W11 or the length L11 of the second holes 362 and 363 is greater than the gap L between the outer side surface of the semiconductor light emitting device 150 and the inner side surface of the first hole 361. Since the width W11 or the length L11 of the second holes 362 and 363 is greater than the gap L between the outer side surface of the semiconductor light emitting device 150 and the inner side surface of the first hole 361, when a metal film is deposited on the second holes 362 and 363 to form the connection electrodes 371, 372, and 373, electrical disconnection can be not formed in the connection electrodes 371, 372, and 373, thereby preventing lighting defects.

According to the embodiment, the thick second insulating layer 340 can be removed by forming the second holes 362 and 363, so that when there are no second holes 362 and 363, the intensity of the electric field in the second holes 362 and 363 can increase. Accordingly, the dielectrophoretic force can increase, and the semiconductor light emitting device 150 can be pulled by a stronger dielectrophoretic force, thereby improving the assembly rate.

Meanwhile, the semiconductor light emitting device 150 can be disposed in the first hole 361.

The semiconductor light emitting device 150 can comprise a red semiconductor light emitting device that generates red light, a green semiconductor light emitting device that generates green light, and a blue semiconductor light emitting device that generates blue light.

For example, during self-assembly, the red semiconductor light emitting device, the green semiconductor light emitting device, and the blue semiconductor light emitting device distributed in the same chamber (1300 in FIG. 8) can be simultaneously moved by the same assembly device 1100, and the corresponding sub-pixels (PX1, PX2, and PX3 in FIG. 4) can be assembled in each first hole 361. When the sizes of the first hole 361 of each sub-pixel (PX1, PX2, and PX3 in FIG. 4) are the same, the red semiconductor light emitting device, the green semiconductor light emitting device, and the blue semiconductor light emitting device may not be assembled in the first hole 361 where they are to be assembled, but can be assembled in another first hole 361. In order to solve this problem, the red semiconductor light emitting device, the green semiconductor light emitting device, and the blue semiconductor light emitting device each can have different shapes, and the first hole 361 can be formed to correspond to the different shapes of the red semiconductor light emitting device, the green semiconductor light emitting device, and the blue semiconductor light emitting device, respectively. Accordingly, since each of the red semiconductor light emitting device, the green semiconductor light emitting device, and blue semiconductor light emitting device having different shapes is assembled in the first hole 361 corresponding to its shape, assembly defects can be prevented.

For example, the shape of the red semiconductor light emitting device can have a circular shape, the shape of the green semiconductor light emitting device can have a first elliptical shape with a first minor axis and a first major axis, and the shape of the blue semiconductor light emitting device can have a second elliptical shape having a second minor axis smaller than the first minor axis and a second major axis greater than the first major axis.

The semiconductor light emitting device 150 can be disposed in the first hole 361 to generate color light. As described above, the semiconductor light emitting device 150 can comprise a red semiconductor light emitting device, a green semiconductor light emitting device, and a blue semiconductor light emitting device. For example, the red semiconductor light emitting device can be disposed in the first sub-pixel (PX1 in FIG. 4), the green semiconductor light emitting device can be disposed in the second sub-pixel PX2, and the blue semiconductor light emitting device can be disposed in the third sub-pixel PX3. Accordingly, a color image can be displayed using red light emitted from the first sub-pixel PX1, green light emitted from the second sub-pixel PX2, and blue light emitted from the third sub-pixel PX3.

The semiconductor light emitting device 150 of the embodiment can be a vertical-type semiconductor light emitting device, but is not limited thereto. In this instance, after the semiconductor light emitting device 150 is assembled in the first hole 361, a first electrode 154 of the semiconductor light emitting device 150 can be electrically connected to a lower electrode wiring, and the second electrode 155 of the semiconductor light emitting device 150 can be electrically connected to the electrode wiring 380. Here, the lower electrode wiring can be the second assembling wiring 322, but is not limited thereto. When thermal compression is performed after the semiconductor light emitting device 150 is assembled in the first hole 361, a bonding layer of the first electrode 154 of the semiconductor light emitting device 150 can be melted by heat and the semiconductor light emitting device 150 can be more strongly adhered to the substrate 310. The semiconductor light emitting device 150 can be attached to the substrate 310 via the melted bonding layer.

Figure 12:
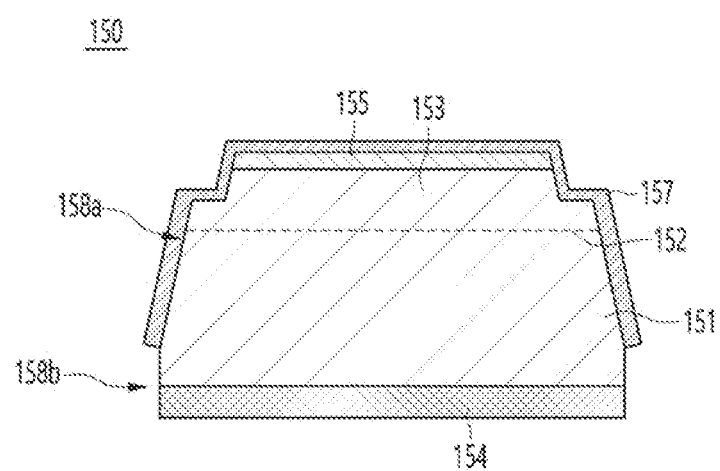
FIG. 12 is a cross-sectional view showing a semiconductor light emitting device according to an embodiment.

FIG. 12 is a cross-sectional view showing a semiconductor light emitting device according to an embodiment.

Referring to FIG. 12, the semiconductor light emitting device 150 according to the embodiment can comprise a light emitting structure 151, 152, and 153, a first electrode 154, a second electrode 155, and a passivation layer 157. The semiconductor light emitting device 150 according to the first embodiment can comprise more components than these.

The light emitting structure 151, 152, and 153 can comprise a first conductivity type semiconductor layer 151, an active layer 152, and a second conductivity type semiconductor layer 153, but can comprise more components.

The first conductivity type semiconductor layer 151, the active layer 152, and the second conductivity type semiconductor layer 153 can be sequentially grown on a wafer (not shown) using deposition equipment such as MOCVD. Thereafter, the second conductivity type semiconductor layer 153, the active layer 152, and the first conductivity type semiconductor layer 151 can be etched along a vertical direction in that order using an etching process. Thereafter, the passivation layer 157 can be formed along perimeters of the remaining region excluding a part of the side surface of the first conductivity type semiconductor layer 151, that is, another portion of the side surface of the first conductivity type semiconductor layer 151, the side surface of the active layer 152, and the side surface of the second conductivity type semiconductor layer 153, so that the semiconductor light emitting device 150 can be manufactured.

The first conductivity type semiconductor layer 151 can comprise a first conductivity type dopant, and the second conductivity type semiconductor layer 153 can comprise a second conductivity type dopant. For example, the first conductivity type dopant can be an n-type dopant such as silicon (Si), and the second conductivity type dopant can be a p-type dopant such as boron (B).

For example, the first conductivity type semiconductor layer 151 can generate electrons, and the second conductivity type semiconductor layer 153 can form holes. The active layer 152 can generate light and can be referred to as a light emitting layer.

When the semiconductor light emitting device 150 of the embodiment is formed by mesa etching, the diameter can gradually increase from the upper side to the lower side of the semiconductor light emitting device 150.

The first electrode 154 can be disposed on a lower side of the first conductivity type semiconductor layer 151. The first electrode 154 can comprise at least one or more layer. For example, the first electrode 154 can comprise a bonding layer for bonding the semiconductor light emitting device 150 to the substrate 310 and an adhesion layer for adhering the lower side of the light emitting structure 151, 152, and 153, for example, to the first conductivity type semiconductor layer 151. For example, the bonding layer can be made of indium (In), tin (Sn), etc. For example, the adhesion layer 154_2 can be made of titanium (Ti), chromium (Cr), etc.

The second electrode 155 can be disposed on the second conductivity type semiconductor layer 153. The second electrode 155 can comprise at least one or more layer. The second electrode 155 can comprise a transparent conductive layer and a magnetic layer. The transparent conductive layer can be made of a transparent conductive material, such as ITO. The transparent conductive layer can achieve a current spreading effect that allows the current generated by a voltage supplied from the electrode wiring 360 to spread evenly throughout the entire area of the second conductivity type semiconductor layer 153.

That is, the current can be spread evenly throughout the entire area of the second conductivity type semiconductor layer 153 by the transparent conductive layer, and holes can be generated in the entire area of the second conductivity type semiconductor layer 153, so that light efficiency can be improved by increasing the amount of hole generation to increase the amount of light generated by recombination of holes and electrons in the active layer 152. The increased light efficiency can lead to improved luminance.

The magnetic layer can comprise nickel (Ni), cobalt (Co), iron (Fe), etc. The magnetic layer can comprise SmCo-based, Gd-based, La-based, or Mn-based metal. The magnetic layer can be magnetized by a magnetic body provided in the assembly device (FIG. 1100) during self-assembly, and can serve to cause the semiconductor light emitting device 150 to exert an attractive force with the magnetic body. Accordingly, the semiconductor light emitting device 150 can move in the same manner as the magnetic body moves.

In order not to interfere with the propagation of light in the semiconductor light emitting device 150, the magnetic layer can be formed to be very thin, on the order of nanometers (nm), allowing light to pass through.

During magnetic assembly, the semiconductor light emitting device 150 can be moved faster and more quickly according to the movement of the magnetic body, thereby shortening the process time and improving the assembly yield.

The passivation layer 157 can protect the light emitting structure 151, 152, and 153. For example, the passivation layer 157 can surround the light emitting structure 151, 152, and 153. For example, the passivation layer 157 can surround the second electrode 155. For example, the passivation layer 157 can be disposed along the perimeter of a side portion of the light emitting structure 151, 152, and 153 and can be disposed on the second electrode 155.

The passivation layer 157 can prevent the semiconductor light emitting device 150 from turning over during self-assembly and allow the lower side of the semiconductor light emitting device 150, that is, the lower surface of the first conductivity type semiconductor layer 151, to face the upper surface of the first insulating layer 330. That is, during self-assembly, the passivation layer 157 of the semiconductor light emitting device 150 can be positioned away from the first assembling wiring 321 and the second assembling wiring 322. Since the passivation layer 157 is not disposed on the lower side of the semiconductor light emitting device 150, the lower side of the semiconductor light emitting device 150 can be positioned to be close to the first assembling wiring 321 and the second assembling wiring 322. Therefore, during self-assembly, the lower side of the semiconductor light emitting device 150 can be positioned facing the first insulating layer 330 and the upper side of the semiconductor light emitting device 150 can be positioned toward the upper direction, so that misalignment in which the semiconductor light emitting device 150 is assembled upside down can be prevented.

Meanwhile, the passivation layer 157 can be disposed along the perimeter of a part of the side portion of the light emitting structure 151, 152, and 153, that is, the first side portion 158a, and may not be disposed along the perimeter of another part of the side portion of the light emitting structure 151, 152, and 153, that is, the second side portion 158b. For example, the first side portion 158a of the light emitting structure 151, 152, and 153 can be a part of the side portion of the first conductivity type semiconductor layer 151, the side portion of the active layer 152, and the side portion of the second conductivity type semiconductor layer 153, and the second side portion 158b of the light emitting structure 151, 152, and 153 can be another part of the side portion of the first conductivity type semiconductor layer 151.

For example, the second side portion 158b of the light emitting structure 151, 152, and 153 can be exposed to the outside because the passivation layer 157 is not disposed in the passivation layer 157. The side portion of the first electrode 154 disposed below the light emitting structure 151, 152, and 153 can also be exposed to the outside. The connection electrodes 371, 372, and 373 of the embodiment can be electrically connected to the second side portion 158b of the light emitting structure 151, 152, and 153 and/or the side portion of the first electrode 154.

The connection electrodes 371 and 372 can be disposed in the second holes 362 and 363 of the second insulating layer 340. The connection electrodes 371 and 372 can be electrically connected to the side portion of the semiconductor light emitting device 150 in the second holes 362 and 363 of the second insulating layer 340. For example, the first side of the connection electrodes 371 and 372 can be electrically connected to the first assembling wiring 321 and/or the second assembling wiring 322 through the first insulating layer 330, and the connection electrodes 371, and the second side of the connection electrodes 371 and 372 can be electrically connected to the side portion of the semiconductor light emitting device 150.

Additionally, the connection electrode 373 can be disposed in the first hole 361 of the second insulating layer 340. The connection electrode 373 can be electrically connected to the side portion of the semiconductor light emitting device 150 in the first hole 361 of the second insulating layer 340. For example, the first side of the connection electrode 373 can be electrically connected to the first assembling wiring 321 and/or the second assembling wiring 322 through the first insulating layer 330, and the second side of the connection electrode 373 can be electrically connected to the side portion of the semiconductor light emitting device 150.

For example, the connection electrodes 371, 372, and 373 can be made of at least one or more layer with excellent electrical conductivity. For example, the connection electrodes 371, 372, and 373 can comprise a first layer containing molybdenum (Mo), a second layer containing aluminum (Al), and a third layer containing molybdenum (Mo).

For example, the connection electrodes 371, 372, and 373 can have a thickness of 300 nm to 800 nm. If the connection electrodes 371, 372, and 373 are less than 300 nm, they may not be deposited uniformly and can break during deposition. If the connection electrodes 371, 372, and 373 exceed 800 nm, the deposition time for forming the corresponding thickness can take too long.

Conventionally, the gap L between the inner side surface of the first hole 361 and the outer side surface of the semiconductor light emitting device 150 is very narrow, and a metal film to form the connection electrode 373 is deposited on the area having the narrow gap L, a phenomenon occurs where the metal film is not continuously connected and is broken. Even if the metal film is patterned to form the connection electrode 373, electrical disconnection occurs at the disconnected portion, resulting in lighting defects.

However, according to the embodiment, the second holes 362 and 363 can be formed by extending laterally from the first hole 361 of the second insulating layer 340 in which the semiconductor light emitting device 150 is assembled, and connection electrodes 371 and 372 can be disposed in the second holes 362 and 363, so that the connection electrodes 371 and 372 can be electrically connected to the side portion of the semiconductor light emitting device 150 without disconnection, thereby preventing lighting defects.

That is, the second holes 362 and 363 extending from the first hole 361 can be empty spaces in which the semiconductor light emitting device 150 is not disposed. Accordingly, after the semiconductor light emitting device 150 is assembled in the first hole 361, when a metal film is deposited on the second insulating layer 340 and the semiconductor light emitting device 150, the gap L between the inner side surface of the second holes 362 and 363 and the outer side surface of the semiconductor light emitting device 150 disposed in the first hole 361 can be increased by at least the extended length L11 of the second holes 362 and 363, a metal film deposited on the area between the inner side surface of the second holes 362 and 363 and the outer side surface of the semiconductor light emitting device 150 disposed in the first hole 361 can be continuous without interruption. Therefore, when the connection electrodes 371 and 372 are formed by patterning the corresponding metal film, the connection electrodes 371 and 372 can be electrically connected to the side portion of the semiconductor light emitting device 150 without electrical disconnection, thereby preventing lighting defects.

Meanwhile, the connection electrode can comprise a first connection electrode 371 disposed in the second-first hole 362 and a second connection electrode 372 disposed in the second-second hole 363.

For example, the first connection electrode 371 can be electrically connected to the first side portion 158a of the semiconductor light emitting device 150 through the first hole 361 in the second-first hole 362. For example, the second connection electrode 372 can be electrically connected to the second side portion 158b of the semiconductor light emitting device 150 through the first hole 361 in the second-second hole 363.

In the embodiment, two connection electrodes, that is, the first and second connection electrodes 371 and 372, can be electrically connected to the side portions of the semiconductor light emitting device 150, but only one connection electrode among the first and second connection electrodes 371 and 372 can be connected to the side portion of the semiconductor light emitting device 150, and the remaining connection electrode can be omitted.

Each of the first and second connection electrodes 371 and 372 can comprise first connection regions 371_1 and 372_1 in contact with the side portions of the semiconductor light emitting device 150, second connection regions 371_2 and 372_2 extending from the first connection regions 371_1 and 372_1 and contacting the upper surface of one of the first and second assembling wirings 321 and 322, and third connection regions 371_3 and 372_3 extending from the second connection regions 371_2 and 372_2 and contacting the inner side surfaces of the second holes 362 and 363.

The upper side of the first connection region 371_1 and 372_1 can be in contact with the passivation layer 157 of the semiconductor light emitting device 150, and the lower side of the first connection regions 371_1 and 372_1 can be in contact with the side surface of the first conductivity type semiconductor layer 151 and/or the side surface of the first electrode 154 of the semiconductor light emitting device 150.

The first connection regions 371_1 and 372_1 and the third connection regions 371_3 and 372_3 can have the same height, but is not limited thereto.

Meanwhile, the connection electrode can comprise a third connection electrode 373 disposed along the perimeter of the semiconductor light emitting device 150 within the first hole 361. For example, the third connection electrode 373 can be disposed between the inner side surface of the first hole 361 and the outer side surface of the semiconductor light emitting device 150.

For example, the first side of the third connection electrode 373 of the first hole 361 can be connected to the first connection electrode 371 in the second holes 362 and 363, and the second side of the third connection electrode 373 of the first hole 361 can be connected to the second connection electrode 372 in the second holes 362 and 363.

The third connection electrode 373 can comprise a first connection region 373_1 in contact with the side portion of the semiconductor light emitting device 150, a second connection region 373_2 extending from the first connection region 373_1 and in contact with the upper surface of one of the first and second assembling wirings 321 and 322, and a third connection region 373_3 extending from the second connection region 373_2 and contacting the inner side surface of the first hole 361.

The first connection region 373_1 and the third connection region 373_3 can have the same height, but is not limited thereto.

Meanwhile, since the first hole 361 and the second holes 362 and 363 can be in communication, when a metal film is deposited to form the connection electrodes 371, 372, and 373, the deposition film can be formed continuously between the first hole 361 and the second hole 362 and 363. Accordingly, the first connection regions 371_1 and 372_1 of each of the first and/or second connection electrodes 371 and 372 within the second holes 362 and 363 can be the first connection region 373_1 of the third connection electrode 373 in the first hole 361. In other words, the first connection region 373_1 can be shared by all of the first to third connection electrodes 371, 372, and 373.

Therefore, the first connection regions 371_1, 372_1, and 273_1 can be in contact with the side portions of the semiconductor light emitting device 150 along the perimeter of the semiconductor light emitting device 150 in the first hole 361, and the second connection region 273_2 can be in contact with an upper surface of one of the first and second assembling wirings 321 and 322 along the perimeter of the semiconductor light emitting device 150 in the second holes 362 and 363. In addition, the second connection region 273_2 of the first hole 361 can extend from the second holes 362 and 363 to the second connection regions 271_2 and 272_2, and the third connection regions 271_3 and 272_3 of the second holes 262 and 263 can extend from the second connection regions 271_2 and 272_2 in the second holes 362 and 363 and can contact the inner side surfaces of the second holes 362 and 363. In addition, the third connection region 273_3 of the first hole 361 can extend from the second connection region 273_2 and contact the inner side surface of the first hole 361.

According to the embodiment, the connection electrodes 371, 372, and 373 can disposed not only in the first hole 361 but also in the second holes 362 and 363, and can also be attached to the inner side surface of the side surface of the semiconductor light emitting device 150, the upper surface of the first and/or second assembling wiring 321 and 322 through the first insulating layer 330, and the inner side surface of the first hole 361 and the second hole 362 and 363, so that the bonding force of the semiconductor light emitting device 150 can be strengthened, and reliability can be improved.

Meanwhile, the first connection electrode 371 can have a first groove 376, the second connection electrode 372 can have a second groove 377, and the third connection electrode 373 can have a third groove 378. The first to third grooves 376, 377, and 378 can be formed by forming each of the first to third connection electrodes 371, 372, and 373 to a thin thickness using a deposition method.

For example, the width W1 of the first groove 376 or the width W2 of the second groove 377 can be greater than the width W3 of the third groove 378.

Meanwhile, the display device 300 according to the first embodiment can comprise a third insulating layer 350.

The third insulating layer 350 can be disposed in each of the first to third grooves 376, 377, and 378. As will be explained later in the manufacturing process, the second insulating layer 340 can serve as a stopper that determines the height of the connection electrodes 371, 372, and 373. That is, the height of the connection electrodes 371, 372, and 373 can be equal to the height of the third insulating layer 350. That is, if the height of the third insulating layer 350 is increased, the height of the connection electrodes 371, 372, and 373 can also be increased.

Meanwhile, the display device 300 according to the first embodiment can comprise a fourth insulating layer 360 and an electrode wiring 380.

The fourth insulating layer 360 can be disposed on the second insulating layer 340 and the third insulating layer 350. The fourth insulating layer 360 can be a planarization layer to easily form the electrode wiring 380 or other layers. Accordingly, an upper surface of the fourth insulating layer 360 can have a flat surface.

The electrode wiring 380 can be disposed on the fourth insulating layer 360 and electrically connected to the semiconductor light emitting device 150 through the fourth insulating layer 360.

For example, the electrode wiring 380 can be electrically connected to the second electrode 155 through the fourth insulating layer 360 and the passivation layer 157 of the semiconductor light emitting device 150.

The first and/or second assembling wiring 321 and 322 can be referred to as a lower electrode wiring, and the electrode wiring 380 can be referred to as an upper electrode wiring.

Accordingly, light can be emitted from the semiconductor light emitting device 150 by a voltage supplied by the second assembling wiring 322 and the electrode wiring 380.

Descriptions omitted above can be easily understood from FIG. 7 and the description related thereto.

The first to fourth insulating layers 330 to 360 can be made of organic or inorganic materials. For example, at least one or more of the first to fourth insulating layers 330 to 360 can be made of an organic material. For example, at least two or more of the first to fourth insulating layers 330 to 360 can be made of the same material.

According to the first embodiment, at least one or more second hole 362 or 363 extending laterally from the first hole 361 in which the semiconductor light emitting device 150 is assembled can be formed, and the connection electrodes 371 and 372 can be disposed in the hole, so that electrical disconnection does not occur in the connection electrodes 371 and 372 and lighting defects can be prevented.

According to the first embodiment, the connection electrodes 371, 372, and 373 can disposed not only in the first hole 361 but also in the second holes 362 and 363, and can also be attached to the inner side surface of the side surface of the semiconductor light emitting device 150, the upper surface of the first and/or second assembling wiring 321 and 322 through the first insulating layer 330, and the inner side surface of the first hole 361 and the second hole 362 and 363, so that the bonding force of the semiconductor light emitting device 150 can be strengthened, and reliability can be improved.

According to the first embodiment, the thick second insulating layer 340 can be removed by forming the second holes 362 and 363, so that when there are no second holes 362 and 363, the intensity of the electric field in the second holes 362 and 363 can increase. Accordingly, the dielectrophoretic force can increase, and the semiconductor light emitting device 150 can be pulled by a stronger dielectrophoretic force, thereby improving the assembly rate.

According to the first embodiment, since the connection electrodes 371, 372, and 373 can be electrically connected along the perimeter of the semiconductor light emitting device 150, even if the semiconductor light emitting device 150 is biased to one side in the first hole 361, a uniform voltage can be supplied, so that image quality can be improved by ensuring uniform luminance between each sub-pixel.

FIGS. 13 to 20 are diagrams explaining a method of manufacturing a display device according to an embodiment.

Figure 13:
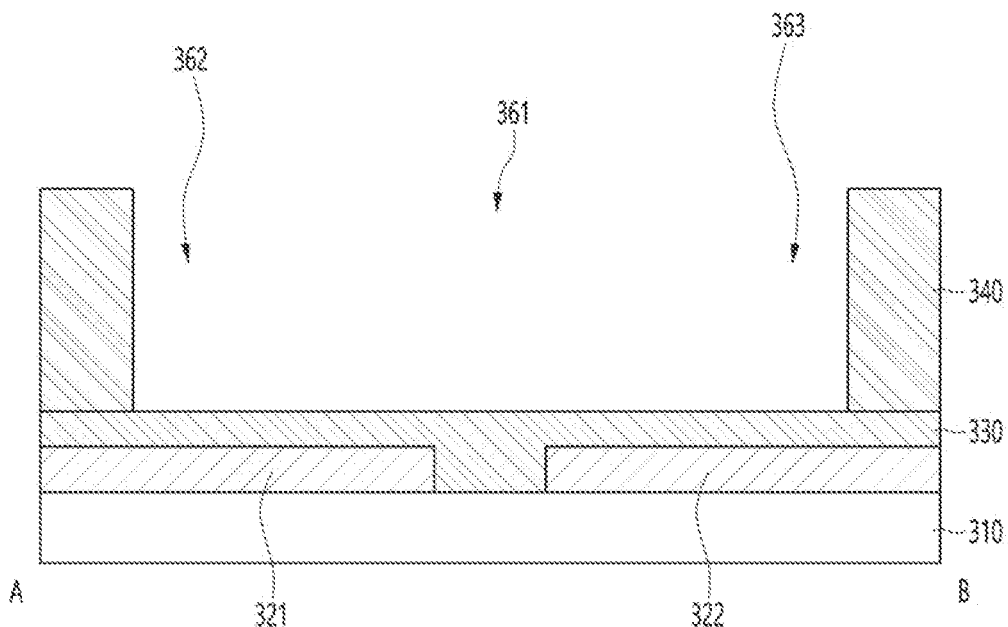
FIGS. 13 to 20 are diagrams explaining a method of manufacturing a display device according to an embodiment.

As shown in FIG. 13, in addition to the first hole 361, second holes 362 and 363 extending laterally from the first hole 361 can be formed in the second insulating layer 340 disposed on the substrate 310. The first hole 361 and the second holes 362 and 363 can be located on the first assembling wiring 321.

Figure 14:
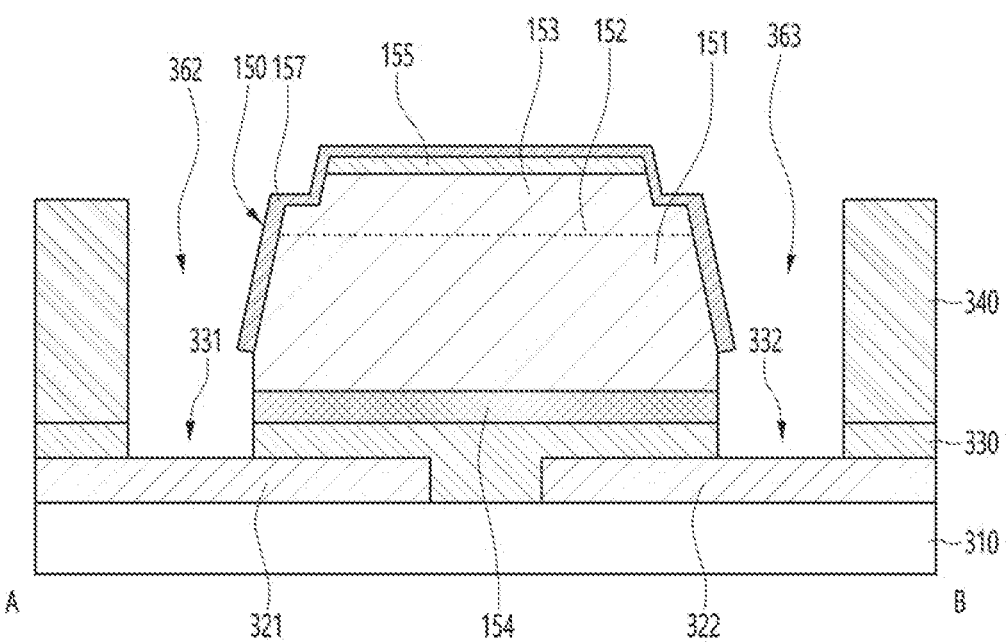

As shown in FIG. 14, the semiconductor light emitting device 150 can be assembled in the first hole 361 by performing a self-assembly process (FIG. 8).

Next, an etching process can be performed to remove the first insulating layer 330 exposed to the first hole 361 and the second holes 362 and 363, so that the first assembling wiring 321 and/or the second assembling wiring can be exposed to the outside. Accordingly, openings 331 and 332, in which the first insulating layer 330 is removed from the first hole 361 and the second holes 362 and 363, and the first assembling wiring 321 and/or the second assembling wiring 322 are exposed to the outside, can be formed.

Although not shown, the first assembling wiring 321 and/or the second assembling wiring 322 can also be removed corresponding to the removed first insulating layer 330. In this instance, a part of the upper surface of the substrate 310 can be exposed to the outside.

Figure 15:
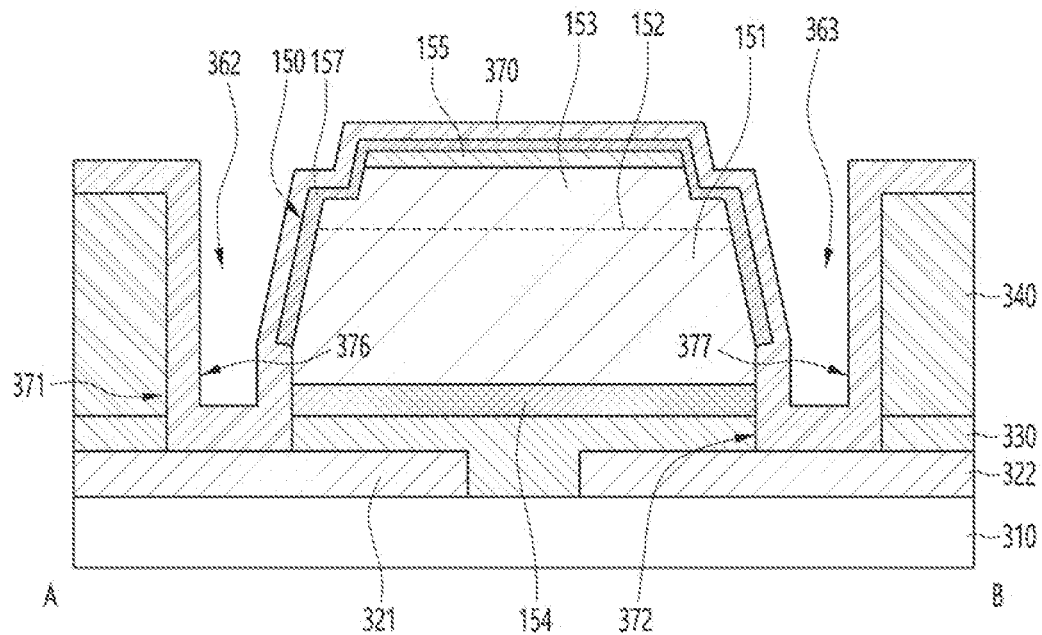

As shown in FIG. 15, a metal film 370 can be deposited on the second insulating layer 340 and the semiconductor light emitting device 150. The metal film 370 can be in contact with the first assembling wiring 321 and/or the second assembling wiring 322 through the openings 331 and 332 in the first and second holes 362 and 363, respectively.

Since the metal film 370 is formed relatively thin, grooves 376 and 377 can be formed by the metal film 370 deposited on the first hole 361 and the second holes 362 and 363.

According to the embodiment, the second holes 362 and 363 extending from the first hole 361 can be formed, and a metal film 370 can be formed on the second holes 362 and 363. Since the width W11 or the length L11 of the second holes 362 and 363 is relatively large, the metal film 370 deposited on the second holes 362 and 363 can be continuous without interruption.

Figure 16:
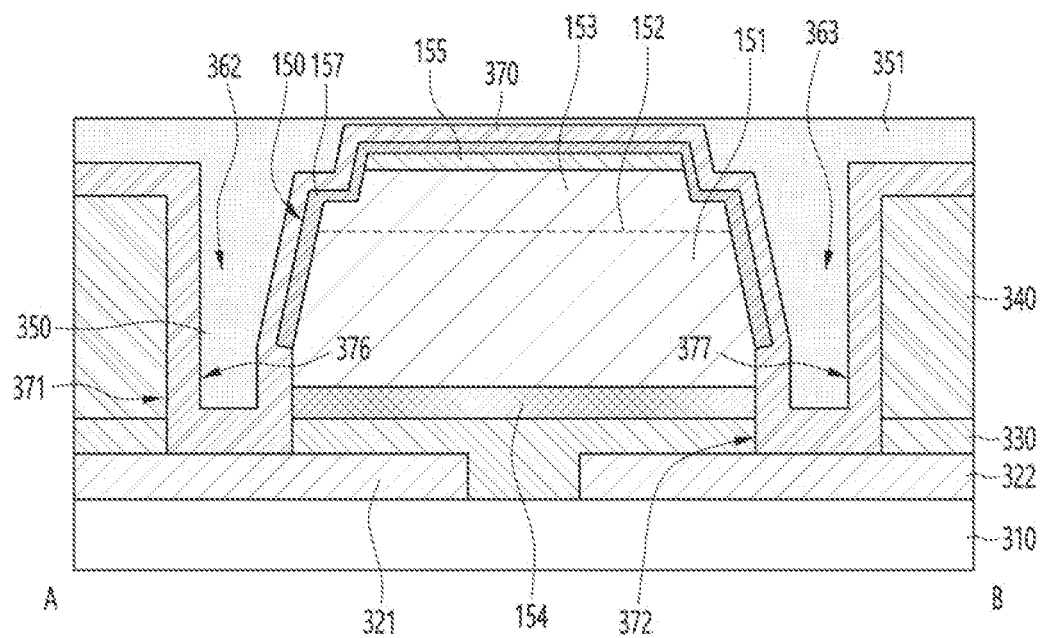

As shown in FIG. 16, an insulating film 351 can be formed on the metal film 370. The insulating film 351 can also be formed in the grooves 376 and 377 formed by the metal film 370 deposited on the first hole 361 and the second holes 362 and 363.

The insulating film 351 can be formed on the upper side of the semiconductor light emitting device 150, but is not limited thereto.

Figure 17:
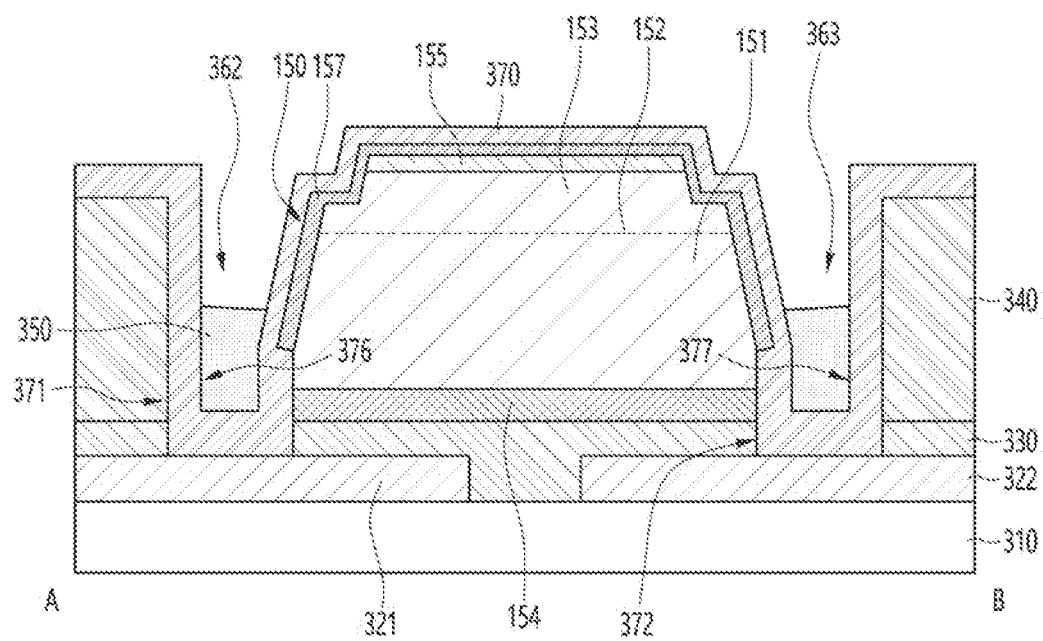

As shown in FIG. 17, the remaining insulating film 351 except for the insulating film 351 formed in the grooves 376 and 377 can be removed by performing an ashing process. The insulating film 351 formed in the grooves 376 and 377 can become the third insulating layer 350.

Figure 18:
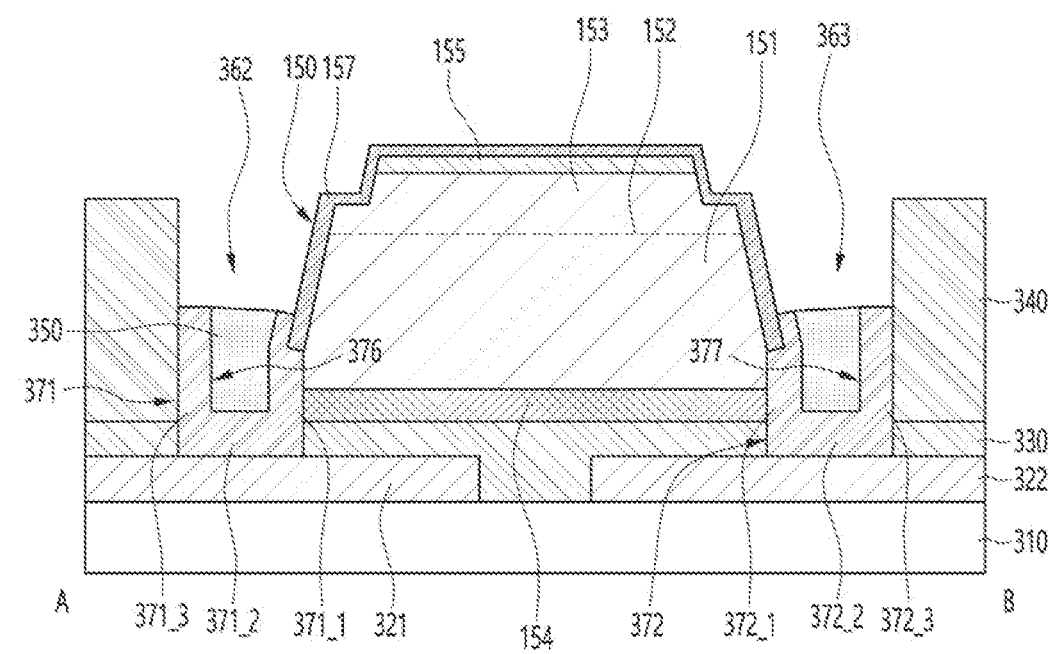

As shown in FIG. 18, the metal film 370 can be removed by performing a patterning process. Since the third insulating layer 350 functions as a mask, the metal film 370 deposited on the first hole 361 and the second holes 362 and 363 may not be removed. Accordingly, the metal film 370 that is not removed from the first hole 361 and the second holes 362 and 363 can become the connection electrodes 371 and 372 and 373.

The second insulating layer 340, the third insulating layer 350, and the metal film 370 on the semiconductor light emitting device can be removed through the patterning process. However, the metal film 370 deposited in the first hole 361 and the second holes 362 and 363 has a thin thickness between the second insulating layer and the third insulating layer 350 and may not be removed any further.

Figure 19:
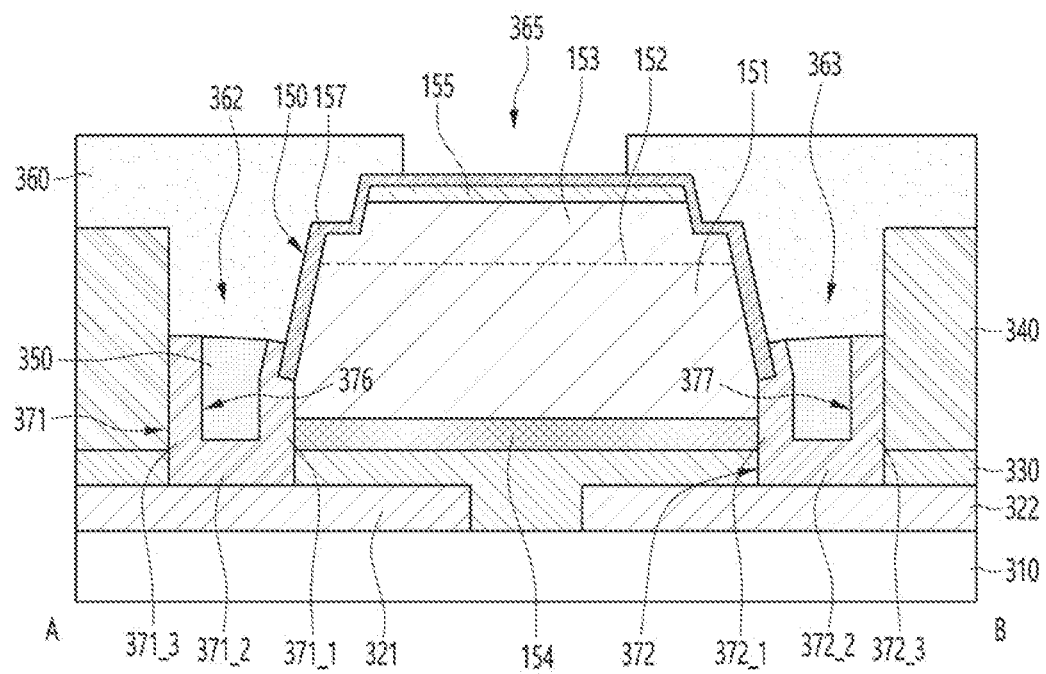

As shown in FIG. 19, a fourth insulating layer 360 can be formed on the second insulating layer 340, the third insulating layer 350, and the semiconductor light emitting device 150, and the fourth insulating layer 360 and the passivation layer 157 of the semiconductor light emitting device 150 can be removed to form a contact hole 365.

Figure 20:
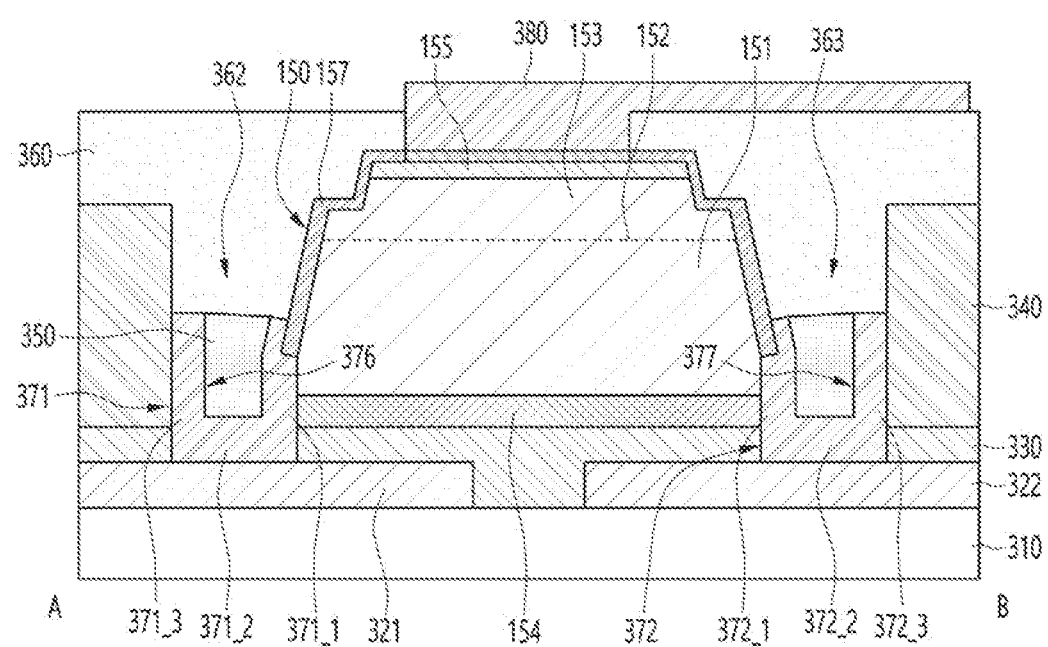

As shown in FIG. 20, an electrode wiring 380 can be formed on the fourth insulating layer 360 and be electrically connected to the second electrode 155 of the semiconductor light emitting device 150 through the contact hole 365.

Second Embodiment

Figure 21:
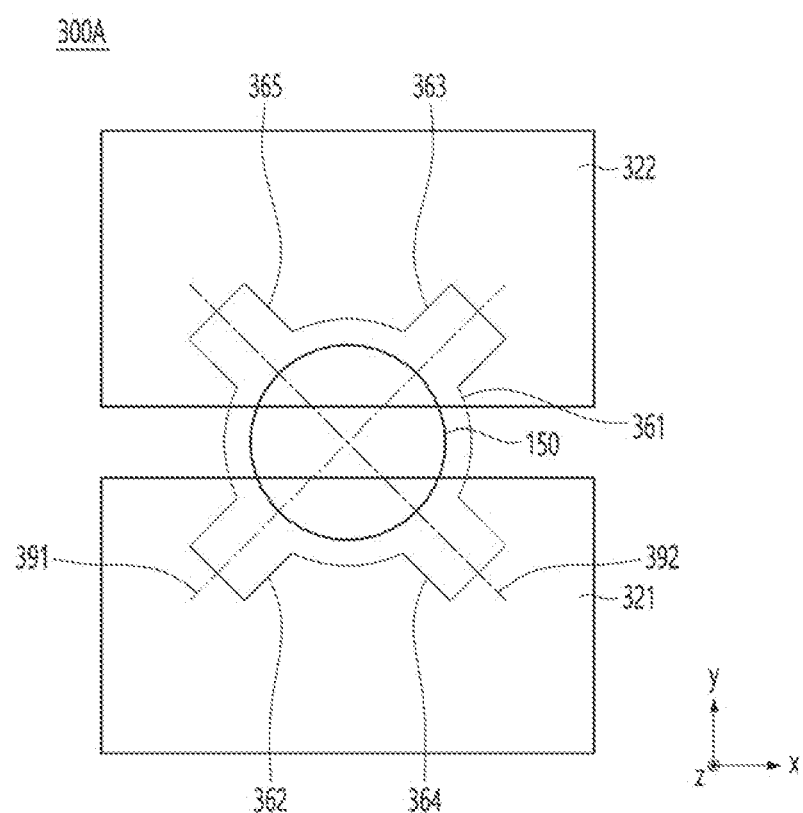
FIG. 21 is a plan view showing a display device according to a second embodiment.

FIG. 21 is a plan view showing a display device according to a second embodiment.

The second embodiment is the same as the first embodiment except for the four second holes 362 to 365. In the second embodiment, components having the same shape, structure, and/or function as those of the first embodiment are given the same reference numerals and detailed descriptions are omitted.

Referring to FIG. 21, in the display device 300A according to the second embodiment, a plurality of second holes 362 to 365 can be formed extending from the first hole 361 along the lateral direction.

The plurality of second holes can comprise a second-first hole 362, a second-second hole 363, a second-third hole 364, and a second-fourth hole 365.

For example, the second-first hole 362 and the second-second hole 363 can be located on a first diagonal line 391. For example, the second-third hole 364 and the second-fourth hole 365 can be located on a second diagonal line 392. The first diagonal line 391 and the second diagonal line 392 can intersect each other at 90 degrees, but is not limited thereto. Accordingly, the second-first hole 362, the second-second hole 363, the second-third hole 364, and the second-fourth hole 365 can be spaced apart from each other by 90 degrees based on the center of the first hole 361.

For example, the second-first hole 362, the second-second hole 363, the second-third hole 364, and the second-fourth hole 365 can be located radially around the first hole 361.

For example, the second-first hole 362 and the second-third hole 364 can be disposed on the first assembling wiring 321, and the second-second hole 363 and the second-fourth hole 365 can be disposed on the second assembling wiring 322.

The connection electrodes (371, 372, and 373 in FIGS. 10 and 11) can be disposed in the first hole 361 and the plurality of second holes 362 to 365. For example, the first connection electrode 371 can be disposed in the first hole 361, the two second connection electrodes can be disposed in the second-first hole 362 and the second-third hole 364, and the two connection electrodes can be disposed in the second-second hole 363 and the second-fourth hole 365.

According to the second embodiment, more connection electrodes can be electrically connected to the semiconductor light emitting device 150, thereby enabling smoother voltage supply and improving luminance.

According to the second embodiment, the semiconductor light emitting device 150 can be more tightly coupled to the substrate 310 by using more connection electrodes, so that the bonding force can be further improved.

According to the second embodiment, the second holes 362 to 365 can be formed at equal intervals from each other, so that during self-assembly, the semiconductor light emitting device 150 assembled in the first hole 361 can be aligned in the normal position without being biased to one side.

Third Embodiment

Figure 22:
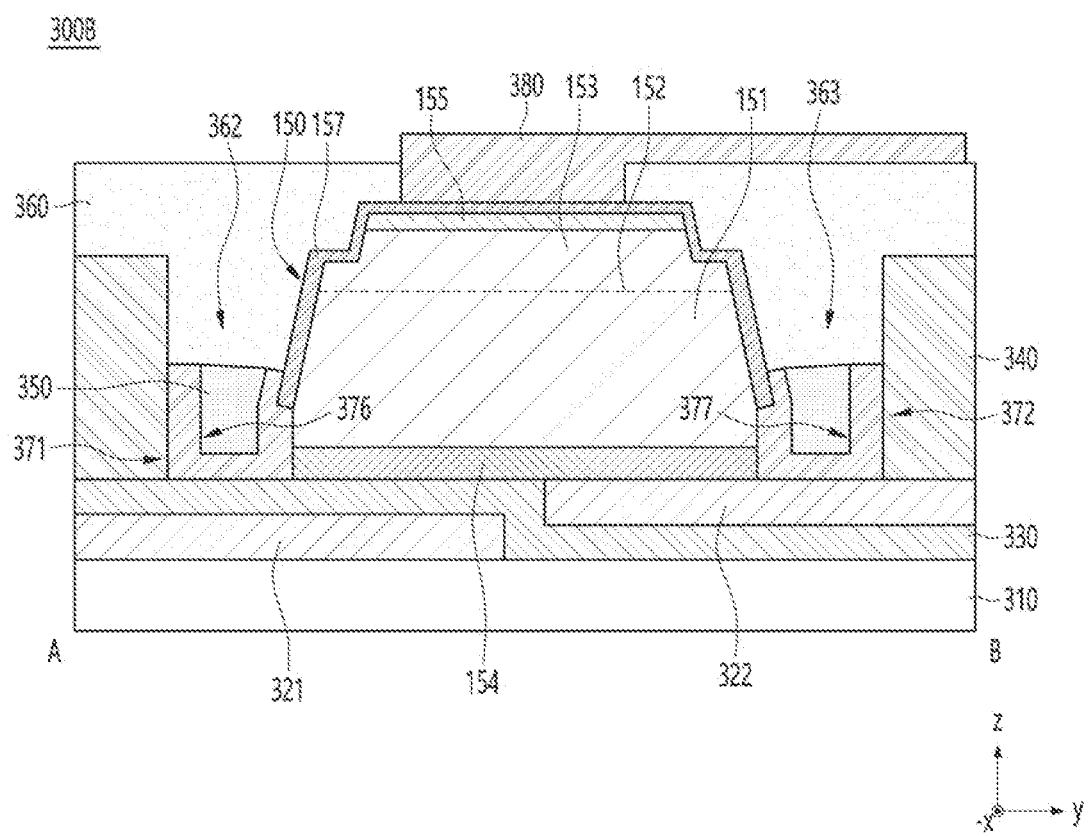
FIG. 22 is a plan view showing a display device according to a third embodiment.

FIG. 22 is a plan view showing a display device according to a third embodiment.

The third embodiment is the same as the first or second embodiment except that the first and second assembling wirings 321 and 322 can be disposed in different layers, and the second assembling wiring 322 and the semiconductor light emitting device 150 can be electrically connected using connection electrodes 371, 372, and 373. In the third embodiment, components having the same shape, structure, and/or function as those of the first or second embodiment are given the same reference numerals and detailed descriptions are omitted.

Referring to FIG. 22, the display device 300B according to the third embodiment can comprise a substrate 310, a first insulating layer 330, first and second assembling wirings 321 and 322, a second insulating layer, a second insulating layer 340, a semiconductor light emitting device 150, connection electrodes 371, 372, and 373, a third insulating layer 350, a fourth insulating layer 360, and an electrode wiring 380.

The first and second assembling wirings 321 and 322 can be disposed in different layers. For example, the first assembling wiring 321 can be disposed between the substrate 310 and the first insulating layer 330. For example, the second assembling wiring 322 can be disposed on the first insulating layer 330 and exposed to the outside through the first hole 361 and the second holes 362 and 363. Additionally, a part of the upper surface of the first insulating layer 330 can also be exposed to the outside through the first hole 361 and the second holes 362 and 363.

The connection wirings can be disposed in the first hole 361 and the second holes 362 and 363. The connection wirings disposed in the second holes 362 and 363 can comprise a first connection wiring 371 and a second connection wiring 372. The first side of the first connection wiring can be electrically connected to the first side portion 158a of the semiconductor light emitting device 150, and the second side of the first connection wiring can be electrically connected to a part of the upper surface of the first insulating layer 330. The first side of the second connection wiring can be electrically connected to the second side portion 158b of the semiconductor light emitting device 150, and the second side of the second connection wiring can be electrically connected to a part of the upper surface of the second assembling wiring 322.

The semiconductor light emitting device 150 can be, for example, a vertical-type semiconductor light emitting device, and can be provided with a bonding layer as a part of the first electrode 154 on the lower side thereof. The bonding layer can be melted through a thermal compression process, and the semiconductor light emitting device 150 and the substrate 310 can be bonded. At this time, the semiconductor light emitting device 150 and the second assembling wiring 322 can be electrically connected via the bonding layer. The second assembling wiring 322 can generate an electric field for self-assembly, while the second assembling wiring 322 can supply voltage for emitting light in the semiconductor light emitting device 150. The second assembling wiring 322 can be a lower electrode wiring.

Tin (Sn) or indium (In) can be used as a bonding layer, but their poor film quality can increase electrical resistance, causing a decrease in luminance. In addition, due to thermal compression, the bonding layer does not exist between the semiconductor light emitting device 150 and the substrate 310, but escapes around the semiconductor light emitting device 150, so that a defective electrical connection can occur between the semiconductor light emitting device 150 and the substrate 310.

To solve this problem, in the embodiment, the side portion of the semiconductor light emitting device 150 and the second assembling wiring 322 can be electrically connected using the connection electrodes 371, 372, and 373.

According to the third embodiment, the lower side of the semiconductor light emitting device 150 can be directly connected to the second assembling wiring 322, and the side portion of the semiconductor light emitting device 150 can be connected to the second assembling wiring 322 using connection electrodes 371, 372, and 373, so that luminance can be improved and lighting defects can be prevented.

Fourth Embodiment

Figure 23:
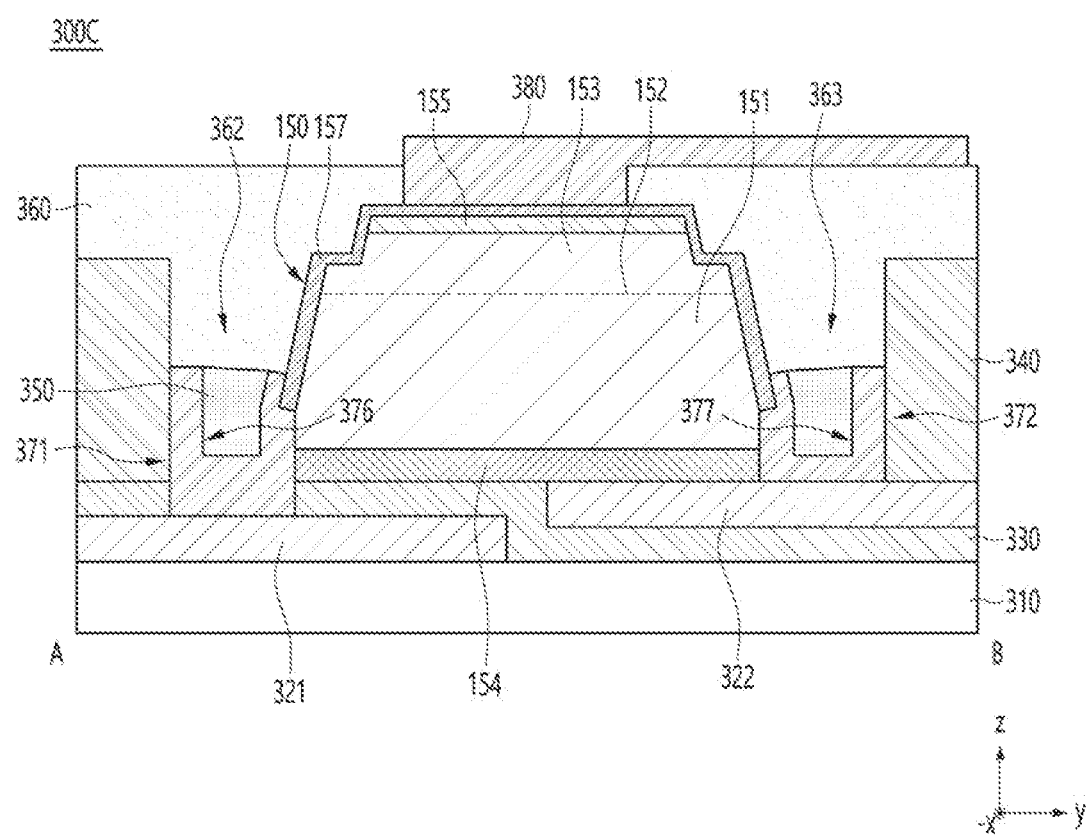
FIG. 23 is a plan view showing a display device according to a fourth embodiment.

FIG. 23 is a plan view showing a display device according to a fourth embodiment.

The fourth embodiment is the same as the third embodiment except that the connection electrodes 371, 372, and 373 can be electrically connected to the first assembling wiring 321 as well as the second assembling wiring 322. In the fourth embodiment, components having the same shape, structure, and/or function as those of the third embodiment are given the same reference numerals and detailed descriptions are omitted.

Referring to FIG. 23, the display device 300C according to the fourth embodiment can comprise a substrate 310, a first insulating layer 330, first and second assembling wirings 321 and 322, a second insulating layer 340, a semiconductor light emitting device 150, connection electrodes 371, 372, and 373, a third insulating layer 350, a fourth insulating layer 360, and an electrode wiring 380.

The first and second assembling wirings 321 and 322 can be disposed in different layers. For example, the first assembling wiring 321 can be disposed between the substrate 310 and the first insulating layer 330. For example, the second assembling wiring 322 can be disposed on the first insulating layer 330 and exposed to the outside through the first hole 361 and the second holes 362 and 363. Additionally, a part of the upper surface of the first insulating layer 330 can also be exposed to the outside through the first hole 361 and the second holes 362 and 363.

The connection wires can be disposed in the first hole 361 and the second holes 362 and 363. The connection wirings disposed in the second holes 362 and 363 can comprise a first connection wiring 371 and a second connection wiring 372. The first side of the first connection wiring can be electrically connected to the first side portion 158a of the semiconductor light emitting device 150, and the second side of the first connection wiring can be electrically connected to a part of the upper surface of the first assembling wiring 321 through the first insulating layer 330. The first side of the second connection wiring can be electrically connected to the second side portion 158b of the semiconductor light emitting device 150, and the second side of the second connection wiring can be electrically connected to a part of the upper surface of the second assembling wiring 322.

For example, the first assembling wiring 321 and the second assembling wiring 322 can be electrically connected to each other after the self-assembly process is completed, so that the same voltage can be supplied to the semiconductor light emitting device 150 through the first assembling wiring 321 and the second assembling wiring 322. The first assembling wiring 321 and the second assembling wiring 322 can be lower electrode wiring.

According to the fourth embodiment, the connection electrodes 371, 372, and 373 can be electrically connected not only to the second assembling wiring 322 but also to the first assembling wiring 321, so that the voltage can be supplied not only from the second assembly wiring 322 but also from the first assembly wiring 321, luminance can be improved and lighting defects can be prevented.

The above detailed description should not be construed as limiting in all respects and should be considered illustrative. The scope of the embodiment should be determined by reasonable interpretation of the appended claims, and all changes within the equivalent range of the embodiment are included in the scope of the embodiment.

The embodiment can be adopted in the display field for displaying images or information.

The embodiment can be adopted in the display field for displaying images or information using a semiconductor light emitting device. The semiconductor light emitting device can be a micro-level semiconductor light emitting device or a nano-level semiconductor light emitting device.

What is claimed is:

1. A display device, comprising:
    a substrate;
    a first insulating layer on the substrate;
    first and second assembling wirings on the substrate;
    a second insulating layer disposed on the first and second assembling wirings and having a first hole and at least one or more second hole extending in a lateral direction of the first hole;
    a semiconductor light emitting device in the first hole; and
    a connection electrode in the second hole,
    wherein the second hole comprises:
        a second-first hole on the first assembling wiring; and
        a second-second hole on the second assembling wiring,
    wherein the connection electrode comprises:
        a first connection electrode disposed in the second-first hole;
        a second connection electrode disposed in the second-second hole; and
        a third connection electrode disposed along a perimeter of the semiconductor light emitting device within the first hole,
    wherein each of the first and second connection electrodes comprises:
        a first connection region in contact with a side portion of the semiconductor light emitting device;
        a second connection region extending from the first connection region and contacting an upper surface of one of the first and second assembling wirings; and
        a third connection region extending from the second connection region and contacting an inner side surface of the second hole,
    wherein a first side of the third connection electrode is connected to the first connection electrode, and
    wherein a second side of the third connection electrode is connected to the second connection electrode.

2. The display device of claim 1, wherein the second-first hole and the second-second hole are located along one direction.

3. The display device of claim 1, wherein the first connection electrode has a first groove, the second connection electrode has a second groove, and the third connection electrode has a third groove, and
    wherein the display device comprises:
        a third insulating layer in the first to third grooves.

4. The display device of claim 3, wherein the width of the first groove is greater than the width of the third groove.

5. The display device of claim 3, wherein the width of the second groove is greater than the width of the third groove.

6. The display device of claim 3, comprising:
    a fourth insulating layer on the second insulating layer and the third insulating layer; and
    an electrode wiring electrically connected to the semiconductor light emitting device through the fourth insulating layer.

7. The display device of claim 1, wherein the second hole comprises:
    two or more second-first holes on the first assembling wiring; and
    two or more second-second holes on the second assembling wiring.

8. The display device of claim 7, wherein the connection electrode comprises:
    two or more first connection electrodes disposed in the two or more second-first holes; and
    two or more second connection electrodes disposed in the two or more second-second holes.

9. The display device of claim 7, wherein the two or more second-first holes and the two or more second-second holes are located radially around the first hole.

10. The display device of claim 1, wherein the width of the second hole is greater than the gap between an outer side surface of the semiconductor light emitting device and an inner side surface of the first hole.

11. The display device of claim 1, wherein the semiconductor light emitting device comprises:
    a light emitting structure;
    a first electrode below the light emitting structure;
    a second electrode on the light emitting structure; and
    a passivation layer on a first side portion of the light emitting structure and the second electrode,
    wherein the connection electrode is configured to contact a second side portion of the light emitting structure and a side surface of the first electrode, and
    wherein the second side portion of the light emitting structure is located below the first side portion of the light emitting structure.

12. The display device of claim 1, wherein the first and second assembling wirings are disposed on the same layer, and
    wherein the connection electrode is electrically connected to at least one assembling wiring of the first assembling wiring and the second assembling wiring.

13. The display device of claim 1, wherein the first and second assembling wirings are disposed in different layers, and
    wherein the connection electrode is electrically connected to at least one assembling wiring of the first assembling wiring and the second assembling wiring.

14. A display device, comprising:
    a substrate;
    a first insulating layer on the substrate;
    first and second assembling wirings on the substrate;
    a second insulating layer disposed on the first and second assembling wirings and having a first hole and at least one or more second hole extending in a lateral direction of the first hole;
    a semiconductor light emitting device in the first hole; and
    a connection electrode in the second hole,
    wherein the second hole comprises:
        a second-first hole on the first assembling wiring; and
        a second-second hole on the second assembling wiring,
    wherein the connection electrode comprises:
        a first connection electrode disposed in the second-first hole;

a second connection electrode disposed in the second-second hole; and
a third connection electrode disposed along a perimeter of the semiconductor light emitting device within the first hole,
wherein the third connection electrode comprises:
a first connection region in contact with a side portion of the semiconductor light emitting device;
a second connection region extending from the first connection region and contacting an upper surface of one of the first and second assembling wirings; and
a third connection region extending from the second connection region and contacting an inner side surface of the first hole,
wherein a first side of the third connection electrode is connected to the first connection electrode, and
wherein a second side of the third connection electrode is connected to the second connection electrode.

15. The display device of claim 14, wherein the first connection region of each of the first and second connection electrodes in the second hole is the first connection region of the third connection electrode in the first hole.

* * * * *